(12) United States Patent
Guðmundsson et al.

(10) Patent No.: US 11,740,262 B2
(45) Date of Patent: Aug. 29, 2023

(54) SUBMETERING SYSTEM

(71) Applicant: ETACTICA EHF., Reykjavík (IS)

(72) Inventors: Kristján Guðmundsson, Reykjavík (IS); Karl Pálsson, Reykjavík (IS); Ragnar Einarsson, Reykjavík (IS)

(73) Assignee: ETACTICA EHF., Reykjavik (IS)

( * ) Notice: Subject to any disclaimer, the term of this patent is extended or adjusted under 35 U.S.C. 154(b) by 0 days.

(21) Appl. No.: 17/979,343

(22) Filed: Nov. 2, 2022

(65) Prior Publication Data

US 2023/0058565 A1 Feb. 23, 2023

Related U.S. Application Data

(63) Continuation of application No. PCT/IB2021/061070, filed on Nov. 29, 2021.
(Continued)

(51) Int. Cl.
   *G01R 15/18* (2006.01)
   *G01R 19/00* (2006.01)
   *H01F 5/00* (2006.01)
(52) U.S. Cl.
   CPC ....... *G01R 15/181* (2013.01); *G01R 19/0092* (2013.01); *H01F 5/003* (2013.01)
(58) Field of Classification Search
   CPC ............ G01R 15/181; G01R 15/186; G01R 19/0092; H01F 5/003
   See application file for complete search history.

(56) References Cited

U.S. PATENT DOCUMENTS 4,709,339 A  11/1987  Fernandes
4,758,962 A   7/1988  Fernandes
(Continued)

FOREIGN PATENT DOCUMENTS

DE  102006059384     2/2013
EP    2282321 A1    2/2011
(Continued)

OTHER PUBLICATIONS

ETactica Power Bar EB-303/EB-306/EB-312 Installation manual, Version 1.0,Apr. 12, 2019, Retrieved from https://etactica.com/wp-content/uploads/2019/08/EB-3XX_Installation_Manual.pdf on Dec. 28, 2020.
(Continued)

*Primary Examiner* — Dominic E Hawkins
(74) *Attorney, Agent, or Firm* — Tarolli, Sundheim, Covell & Tummino L.L.P.

(57) ABSTRACT

A current sensor includes a first component and a second component shaped to fit together to create a combined unit with multiple openings through the combined unit. The opening is bounded on a first side by the first component and on a second side by the second component. The first component and the second component are configured to be fitted together around current-carrying conductors passing through the openings. The first component includes first portions of an inductive energy harvesting device and a current sensing device, both proximal to the first side of the opening. The second component includes second portions of the inductive energy harvesting device the current sensing device, both proximal to the second side of the opening. The inductive energy harvesting device may include a split-core ferrite current transformer and the current sensing device may include a Rogowski coil.

20 Claims, 9 Drawing Sheets

Related U.S. Application Data

(60) Provisional application No. 63/186,275, filed on May 10, 2021, provisional application No. 63/134,670, filed on Jan. 7, 2021.

(56) References Cited

U.S. PATENT DOCUMENTS

| | | | |
|---|---|---|---|
| 7,453,267 B2 | 11/2008 | Westbrock, Jr. | |
| 9,310,397 B2 * | 4/2016 | El-Essawy | G01R 15/142 |
| 2003/0001702 A1 * | 1/2003 | Bach | H02B 11/26 |
| | | | 335/9 |
| 2006/0274481 A1 | 12/2006 | Nelson | |
| 2008/0077336 A1 | 3/2008 | Fernandes | |
| 2008/0284614 A1 | 11/2008 | Perez | |
| 2010/0207604 A1 | 8/2010 | Bitsch | |
| 2011/0208450 A1 | 8/2011 | Saika | |
| 2012/0078680 A1 | 3/2012 | Tharp | |
| 2013/0207638 A1 | 8/2013 | Gross | |
| 2014/0167786 A1 * | 6/2014 | Gutierrez | G01R 15/181 |
| | | | 324/654 |
| 2014/0167787 A1 | 6/2014 | Sanchez | |
| 2016/0091533 A1 | 3/2016 | Soleillant | |

FOREIGN PATENT DOCUMENTS

| | | |
|---|---|---|
| WO | 2010102150 A1 | 9/2010 |
| WO | 2014009976 A1 | 1/2014 |

OTHER PUBLICATIONS

ETactica, Split-Core Current Transformers Datasheet, Mar. 2020, Retrieved from https://etactica.com/wp-content/uploads/2019/07/et-sc-cts-datasheet-v2020.03.pdf on Dec. 28, 2020.

International Search Report and Written Opinion dated Mar. 14, 2022, for corresponding International Application No. PCT/IB2021/061070.

Wibeee, Wibee ONE, Retrieved from https://wibeee.com/en/product/wibeee-one-2w/#tab-description on Nov. 11, 2020.

Guðmundsson, et al., Submetering System, Unpublished International Patent Application PCT/IB2021/061070, International Filing Date Nov. 29, 2021.

Schneider Electric Global, PowerTag, Retrieved from https://www.se.com/ww/en/product-range-presentation/63626-powertag/ on Nov. 11, 2020.

Schneider Electric, Powertag Application Guide & Catalogue, Feb. 2017, Retrieved from https://download.schneider-electric.com/files?p_enDocType=Catalog&p_File_Name=SE9776_powertag_catalogue_combined_WEB.pdf&p_Doc_Ref=SE9776 on Dec. 28, 2020.

* cited by examiner

SUBMETERING SYSTEM

CROSS-REFERENCE TO RELATED APPLICATIONS

This application is a continuation of International Patent Application PCT/IB2021/061070 filed Nov. 29, 2021, which claims the benefit of U.S. Provisional Application 63/134,670 filed Jan. 7, 2021, and U.S. Provisional Application 63/186,275 filed May 10, 2021, all three of which are hereby incorporated by reference in their entirety herein for any and all purposes.

BACKGROUND

Technical Field

The present subject matter relates to measuring electrical power on a circuit-by-circuit basis in a service panel.

Background Art

Electrical power is typically distributed to individual circuits of a building in a service panel. The service panel commonly includes a circuit-breaker for each circuit that provides over-current protection for the circuit. The circuit-breakers are typically arranged at regular intervals along a bus which provides the electrical power from the main power meter for the building. The main power meter measures the total electrical power used by the building but cannot separately measure the electrical power used for each individual circuit.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

Figure 1:
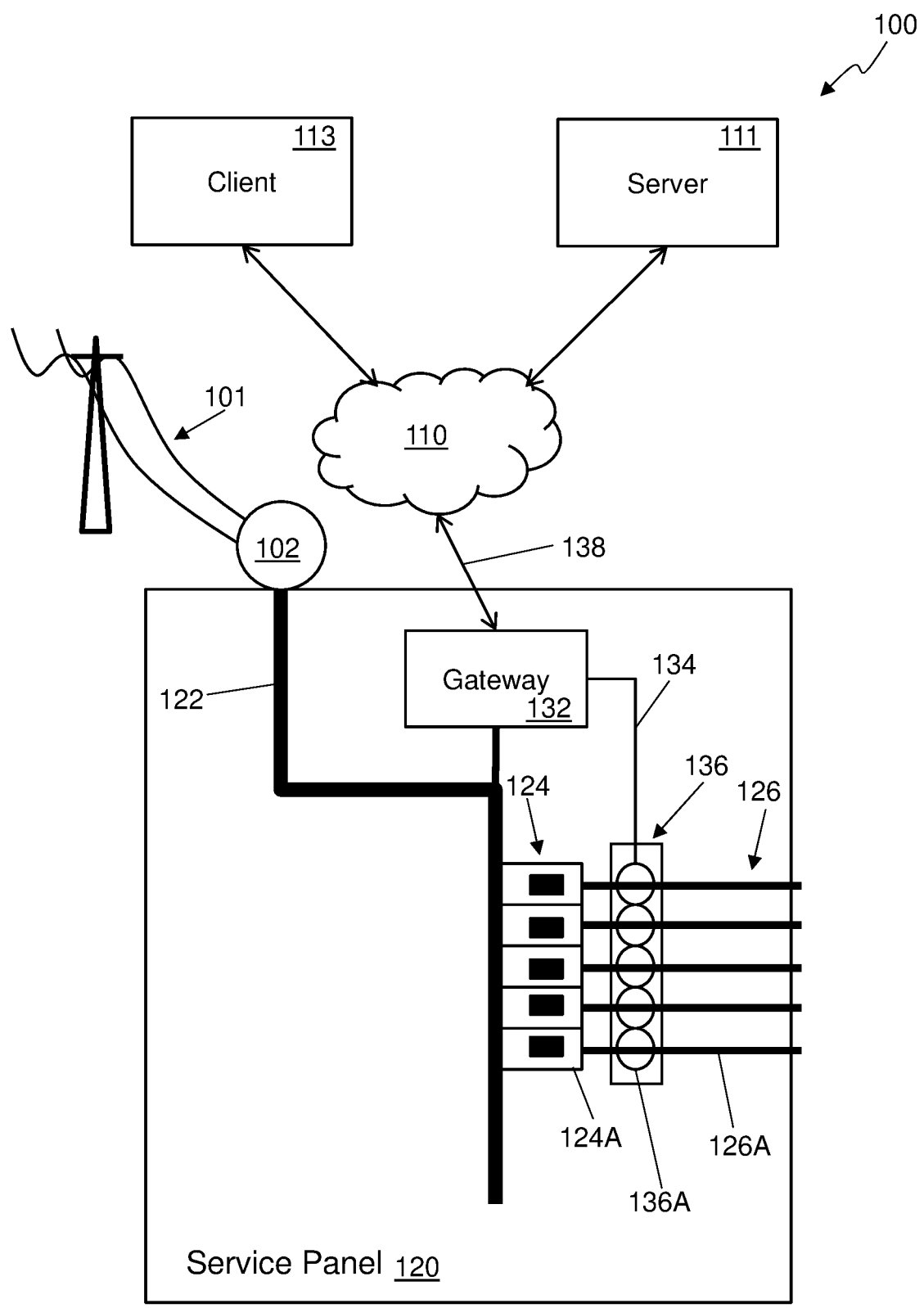
FIG. 1 is a block diagram of an embodiment of a submetering system.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification.

Traditionally, power is delivered to a premises from an electrical power utility through an electrical meter that is used to monitor the amount of power delivered to the premises. The utility can then access the meter to determine an amount of energy (power over time) used so that the utility can then charge their customer based on the amount of energy that was actually used. But in traditional systems, the amount of power delivered to individual loads, or individual circuits, cannot be separately determined or reported by the single electrical meter used for billing purposes.

A submetering system that may be separate from the traditional power meter can be used to measure power and/or energy used by individual loads or individual circuits. A submetering system may measure the power used by the load/circuit at regular intervals and report this amount over a network to allow a user to determine which loads/circuits are actually consuming the power being purchased from the utility.

Various submetering systems may work in different ways. Some submetering systems may instrument particular loads, such as an air conditioner or water heater, to monitor the energy usage by those loads. Other submetering systems may utilize devices designed to be interposed between an electrical outlet and a load. In some cases, a submetering system may place a sensor on a conductor as it leaves the service panel or on the conductor near where it connects to its circuit breaker inside the service panel. Any combination of instrumentation may be used in various embodiments.

In systems that place sensors inside the service panel on the conductors near the circuit breakers, space may be limited due to the spacing of the circuit breakers. Some sensors, such as the Power Bar EB from eTactica provide ganged sensors which can monitor multiple conductors separately by providing multiple openings for individual conductors. The openings are designed to match the pitch of circuit breakers in a service panel to allow for many sensors to be installed in a minimum amount of space. If the Power Bar EB is retrofitted in an existing service panel, the conductors need to be removed from the breakers to allow the current sensors to be installed because the conductors must be inserted through the openings in the Power Bar EB sensors before they are reinserted into their respective circuit breakers. This can be time consuming and disruptive due to the need to turn off the circuit breakers which turns off power to the circuits.

eTactica and other companies also provide split core current transformers that provide a stepped-down AC current that can then be measured by a separate device. While this design may make it easier to retrofit existing service panels, it takes more space than the Power Bar EB and it may be difficult to install on every circuit within a service panel.

Disclosed herein is a ganged current sensor that uses split ferrite cores and/or split Rogowski coils set at regular circuit breaker spacing to allow for easy installation in an existing service panel without the need to disconnect the conductors from the circuit breaker. Embodiments of the ganged current sensor include a first component and a second component shaped to fit together to create a combined unit with multiple openings through the combined unit that can each surround an electrical conductor. The two components may be held together using clips, latches, screws, straps, or other fasteners. The openings are each bounded on a first side by the first component and on a second side by the second component. The first component includes split ferrite core halves respectively proximal the first side of the openings. The second component includes split ferrite core halves respectively proximal the second side of the openings with current sense circuits coupled to the split ferrite core halves and a processor coupled to the sense circuits. The processor is programmed to take current measurements for conductors in the openings send the current measurements over a wireless communication network to a gateway or other computer which can store and/or process the power usage information for the individual circuits.

In another embodiment, ganged current sensors may use Rogowski coils instead of split-core ferrite current sensors to measure the current through each circuit. The ganged current sensors may include two separate components similar to the two components described for the ganged ferrite current sensors except that a conductive connection, such as a connector, is included between the two components to connect a first portion of each Rogowski coil in the first component to a second portion of each respective Rogowski coil in the second component. An alternative embodiment may use flexible Rogowski coils for each circuit in the ganged current sensor so that during installation, the flexible Rogowski coils can be positioned to wrap around the respective conductors to measure the currents. Embodiments using two split-core ferrite core current transformers on each circuit are also contemplated, one to harvest power and one for measurements.

In another embodiment, ganged current sensors may use split ferrite core haves to extract power from the monitored circuits and Rogowski coils to measure the current through each circuit. A single circuit flows through the center of the current transformer made from split ferrite cores and a split Rogowski coil or a flexible Rogowski coil wrapped around the conductor of the circuit. The ganged current sensors may include two separate components similar as described above that holds the two halves of the split ferrite cores close together and includes a conductive connection, such as one or more connector, to connect a first portion of each Rogowski coil in the first component to a second portion of each respective Rogowski coil in the second component. In such embodiments the two components may be rigid with each component holding its respective ferrite core half and Rogowski coil portion. In an alternative component a first set of two components may house inductive energy harvesting device(s) and an additional pair of components may house the current sensing device(s) such as split Rogowski coil(s). Alternatively, ganged current sensors may include two separate components similar as described above that holds the two halves of the split ferrite cores close together with a flexible Rogowski coil for each circuit extending from one of the components to allow them to be wrapped around respective conductors or a pair of components may include the split ferrite cores with a third component including one or more flexible Rogowski coils.

The ganged current sensors may communicate with a gateway device using wired or wireless communication. In at least one embodiment, the ganged current sensors utilize a Bluetooth® network to communicate with the gateway device and can communicate both amplitude and phase information about the current flowing through the conductors located within its openings in near real-time.

The ganged current sensors may receive power for its internal electronics from several different sources, depending on the embodiment. The power in some embodiments may be obtained through a separate wired connection to the gateway or other device which supplies power. In other embodiments, the ganged current sensors may have a pin, extension, or other conductor (collectively referred to hereinafter simply as a pin) near one or more of the openings which can be inserted into the circuit breaker with the conductor feeding that circuit to allow the ganged current sensor to receive electrical power from the circuit breaker.

In at least one embodiment, power may be received by inductively coupling to the conductors of the circuits. The inductive coupling for power may be done using the current sensor or by using a separate power winding/coil to inductively obtain power from the conductor being monitored, collectively referred to as inductive power sources. In systems where separate power windings/coils are used, they may be integrated into the same housing as the current sensors so that once the ganged current sensor is installed, the separate power windings/coils are concurrently installed. The inductive power sources for the separate circuits being monitored may feed into a single power supply for the ganged current sensor so that if power is not flowing in one or more of the circuits, power obtained from at least one active circuit being monitored by the ganged power sensor may power the entire ganged current sensor. The ganged current sensor may also include an energy storage device (e.g. a rechargeable battery or supercapacitor) that is charged when excess power is available from the inductive power sources and then used to power the ganged current sensor during times when the amount of current flowing in the monitored circuits is insufficient to allow enough power to be harvested to power the ganged current sensor.

The use of the two components each having half of the ferrite core or the flexible Rogowski coils each make installation easier and cheaper as up to half of project costs may be related to installation, including wiring, networking, and power disruption planning. In some cases, the disruption to the network and power distribution caused with prior solutions may be enough to completely halt a project or delay it for long periods of time. The embodiments described herein avoid those problems as installation can occur with no disruption to the networking and power distribution infrastructure of the premises because the ganged power sensors described herein allow the current sensors to be installed without disconnecting power for individual circuits at the breaker and no new wires are required for communication to the gateway as that can be performed using wireless communication, although some embodiments may include a wired connection to allow the ganged current sensors to be used with existing gateways or third party devices. Embodiments may be configured to have any number of openings capable of surrounding current-carrying conductors, and embodiments having one, two, three, four, five, and six openings are explicitly envisioned. Embodiments having 8, 10, 12, and 16 openings are also envisioned.

The ganged current sensors can measure several different electrical parameters for each circuit. Measurements of current amplitude and phase can be made along with frequency and temperature in some embodiments. In embodiments that electrically connect to the circuit using the pins, voltage measurements may be made. In embodiments that have a pin for each circuit, separate voltage measurements may be taken for each circuit. A voltage measurement may include amplitude, phase, and/or frequency. Power may be calculated within the ganged current sensor based on the current and voltage measurements in some embodiments. Some embodiments may also measure and/or calculate other parameters such as, but not limited to, energy usage, harmonic distortion, and voltage and/or current phase-to-phase angle for multi-phase installations.

Some submetering systems include a gateway device that receives sensor data from the current sensors and relays it to a remote computer for storage, analysis, and/or display. Some embodiments may integrate the gateway device into a ganged current sensor. The gateway device may be located within the service panel and may directly connect to the bus bars for power, although it may also reside outside of the service panel and/or have a separate power supply that plugs into an electrical outlet. The gateway device may also include a voltage measurement sensor to allow it to measure the voltage amplitude and/or phase which can then be used with the current measurements from the current sensor to calculate power and/or energy usage. It can be assumed in most embodiments that the voltage measurement taken at the gateway device located in the same service panel as the current sensor will be very close to the actual voltage delivered to a circuit monitored by the current sensor. The gateway device may include a wired and/or wireless interface to communicate with the current sensors. Any type of wired or wireless interface may be included, including, but not limited to, an RS-485 wired interface or a Bluetooth wireless interface. The gateway device may also include a separate wired and/or wireless interface to communicate with a remote computer, such as Ethernet, a variant of 802.11 (Wi-Fi), or a 4G/5G cellular connection.

In some embodiments, the gateway device may store the voltage/current/power information locally and allow a client device to directly access the data stored in the gateway device. The gateway device may even include a web server to present web pages to the client showing the stored data. Various embodiments may perform different types of analysis and present the data in different ways so that no internet access to cloud services is required. In other embodiments, the gateway device may simply store and forward information from the sensors to a cloud server with most of the calculations and analysis taking place on the cloud server.

Reference now is made in detail to the examples illustrated in the accompanying drawings and discussed below.

FIG. 1 is a block diagram of an embodiment of a submetering system 100. Electrical power is provided from a power source 101, such as the electrical power gird, to a service panel 120 of a premises or building. An electrical meter 102 may measure the amount of electrical power delivered to the service panel 120. The electrical power is distributed within the service panel 120 by one or more bus bars 122 to circuit breakers 124 which each provide over-current protection for one of the circuits 126 which feed electrical power to the various loads on the premises. The service panel 120 may also include a master circuit breaker (not shown) that can disconnect the electrical power from the bus bars 122.

The submetering system 100 includes a ganged current sensor 136 that can monitor 5 separate circuits, although other embodiments may monitor different numbers of circuits. The ganged current sensor 136 includes a current sensor 136A that monitors current flowing through conductor 126A the passes through the opening of the current sensor 136A. Conductor 126A received its electrical power though circuit breaker 124A which provides over-current protection for the circuit fed by conductor 126A.

The ganged current sensor 136 takes one or more current measurements from one or more of the conductors 126, including using current sensor 136A to take a current measurement for conductor 126A, and sends them over communication link 134 to gateway 132. The ganged current sensor 136 may extract power from one or more of the circuits 126 that it is monitoring. The power may be extracted using the one or more coils being used as current sensors, such as current sensor 136A, or may be done by a separate coil or coils positioned on the wires of the circuits 126. In some embodiments, the ganged current sensor 136 may also take voltage measurements, temperature measurements, frequency measurements, or other measurements and send those to the gateway 132. The ganged current sensor 136 may also perform analysis on the measurements, such as harmonic distortion calculations or phase-to-phase calculations and send those calculated data to the gateway 132. The gateway 132 may connect to the bus bar 122 and may in some embodiments take voltage measurements for the bus bar 122 and use those as the voltage provided to each conductor 126.

The gateway 132 can communicate over communications link 138 through a network 110, such as a local area network (LAN) or an internet, to other computers, such as a server 111 and/or a client 113. In some embodiments, the same network 134/138 may be used for communication with the ganged current sensor 134 and another computer 111/113, although they are separate links/networks many embodiments.

The server 111 may store information received from the gateway 131 in a database or as files on computer readable media and may process the data in various ways, such as to prepare energy usage information on a circuit-by-circuit basis or any other type of analysis or processing of the information. The raw and/or processed information may be formatted into reports which may be stored as filed, stored in the database, put into web pages, or prepared in any other way to make the information understandable to a human.

The client 113 may access the raw information, the processed information, and/or the reports created by the server 111. In some embodiments the client 113 may access the web pages stored on the server 111 using a browser to present the reports to a person. The client 113 may also directly access data stored in the gateway 132 to present to a user in at least some embodiments.

Figure 2A:
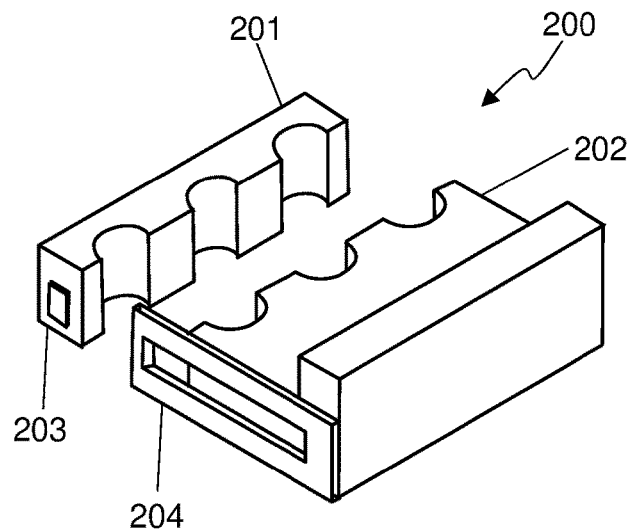
FIGS. 2A, 2B, and 2C show different views of an embodiment of a ganged multi-circuit current sensor.
Figure 2B:
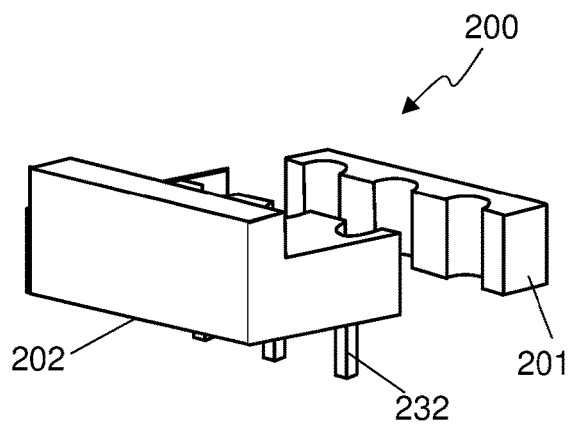
Figure 2C:
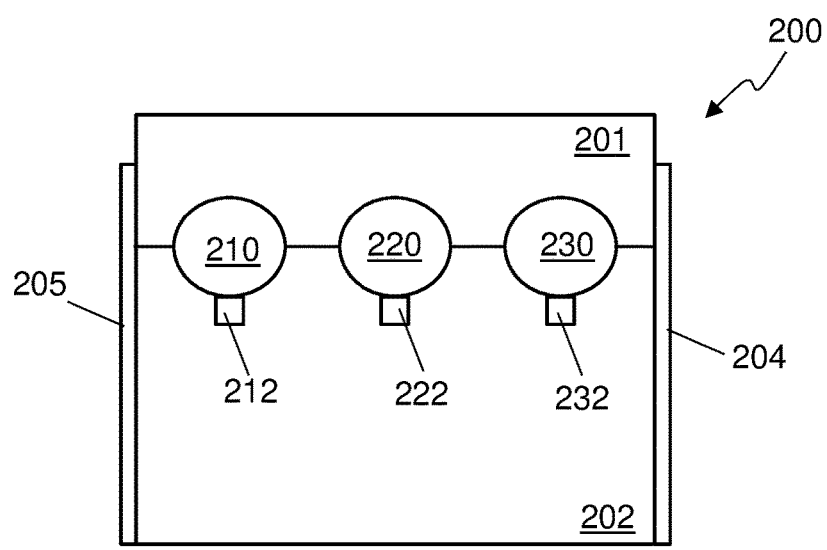

FIG. 2A shows a front, top, right perspective view of the ganged multi-circuit current sensor 200 and FIG. 2B shows a top, left, front perspective view of the ganged multi-circuit current sensor 200. FIG. 2C shows a rear elevation view of the ganged multi-circuit current sensor 200. The ganged multi-circuit current sensor 200 has a first component 201 and a second component 202. The two components are shaped to fit together with the first component 201 positioned below the second component to create a combined unit which is the ganged multi-circuit current sensor 200. A mechanism to hold the two components 201/202 together may be included such as the bump 203 and latch 204 on one side. Some embodiments may include an additional clip 205 (not shown in FIGS. 2A and 2B) on the other side although other embodiments may use other mechanisms to hold the first component 201 together with the second component 202, including, but not limited to, snaps, straps, screws, magnets, latches, or hook and loop fasteners.

The current sensor 200 includes two or more openings 210, 220, 230 through the combined unit 200 suitable to surround a conductor for a circuit in a service panel. The openings 210, 220, 230 are created by putting the two components 201, 202 together. While three openings 210, 220, 230 are shown, other embodiments may have any number of openings. The first opening 210, the second opening 220, and the third opening 230 are bounded on the bottom side by the first component 201 and on the top side by the second component 202. The openings 210, 220, 230 are spaced at a pitch (i.e. distance apart) designed to match a particular brand or model of circuit breaker as installed in a service panel. In some embodiments, the pitch may be 1 DIN unit (i.e. 17.5 mm), 27 mm, or any other pitch to match a particular brand or model of circuit breaker. The openings 210, 220, 230 are sized to easily allow a conductor to fit into the openings, such as a 14 AWG (American Wire Gauge) wire for a 15 Amp circuit, a 12 AWG wire for a 20 Amp circuit, a 10 AWG wire for a 30 Amp circuit, or an 8 AWG wire for a 50 Amp circuit. In at least one embodiment, the openings are about 8 mm in diameter to allow an insulated wire between 14 AWG and 6 AWG (inclusive) to fit through the opening. Other embodiments may have different sized openings, depending on the gauge of wire around which they are intended to be installed.

In some embodiments pins 212, 222, 232 extend from the second component 202 which can be used to make electrical contact with their associated circuit at the circuit breaker. These pins can take any form and may vary depending on the model of circuit breaker for which they are designed to be used. The pins 212, 222, 232 may be designed to make contact with a portion of the circuit breaker or they may be designed to be inserted into the circuit breaker with the conductor.

The current sensor 200 may be installed into a service panel by sliding the first component 201 under conductors to be monitored and then attaching the second component 202 above the conductors to mate with the first portion 201 and individually surround each conductor in one of the openings 210, 220, 230. The clips 204, 205 may be used to attach the first component 201 to the second component 202.

Figure 3:
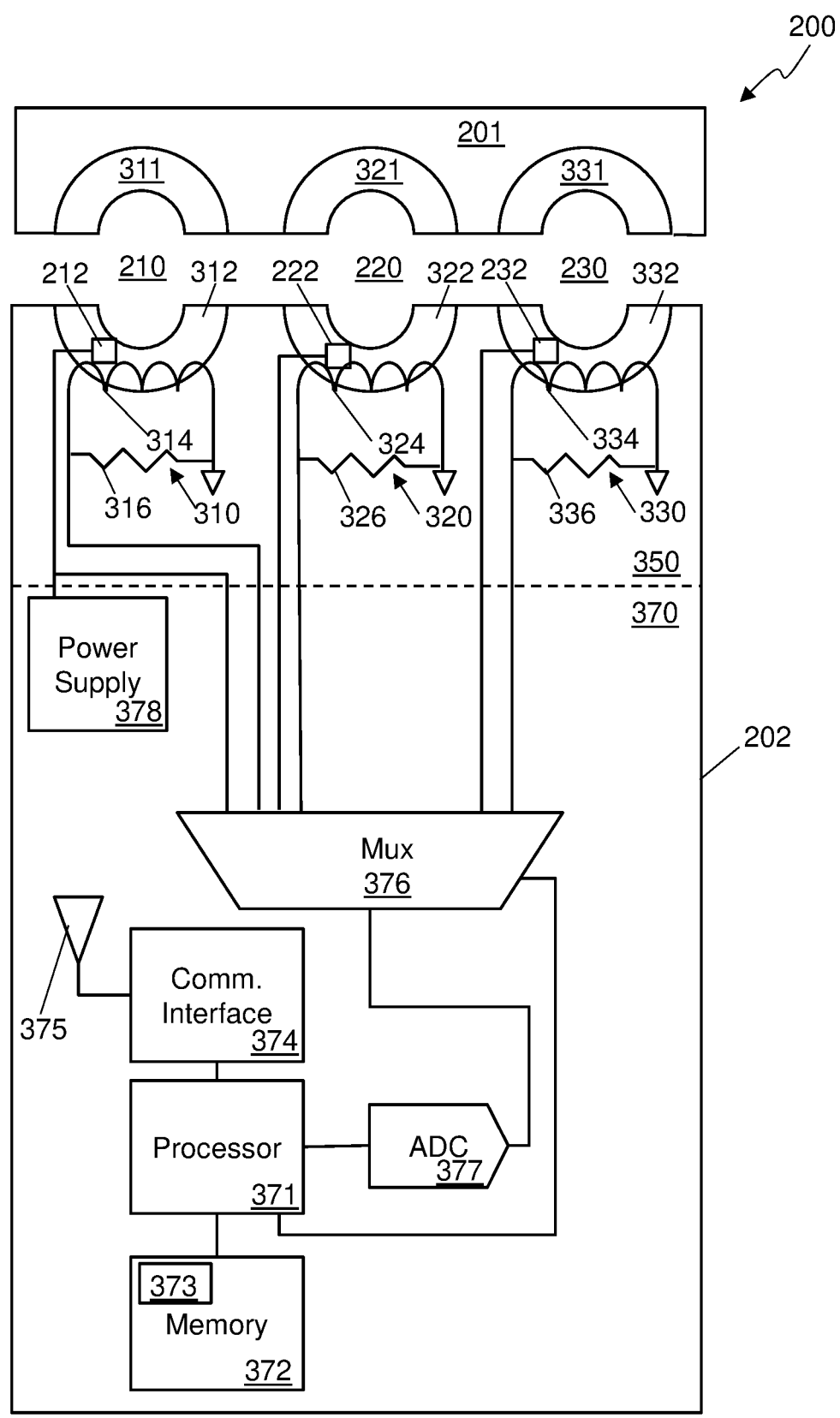
FIG. 3 is a block diagram of the embodiment of the ganged multi-circuit current sensor.

FIG. 3 is a block diagram of the embodiment of the ganged multi-circuit current sensor 200. The current sensor 200 includes the first component 201 and the second component 202. The first component has a split ferrite core half 311 proximal to the first opening 210, a split ferrite core half 321 proximal to the second opening 220, and a split ferrite core half 331 proximal to the third opening 230. In some embodiments the ferrite core halves 311, 321, 331 are completely encased in an enclosure for the first component 201 but in other embodiments, a structure of the first component 201 may expose some portion of the ferrite core halves 311, 321, 331, such as the outer surface facing the second component 202, to allow for physical contact between the core halves 311, 321, 331 of the first component 201 and the core halves 312, 322, 332 of the second component 202.

The second component 202 includes two subsections, an electronics subsection 370 and a sensor subsection 350. In embodiments the two subsections 370, 350 may be integrated into the same physical device 202 and may share elements of their physical design but may be thought of separately for easier understanding. Other embodiments may use a modular physical design where the sensor subsection 350 and the electronics subsection 370 may be mechanically separated, but still function together as a unit.

The embodiment of the sensor subsection 350 of the ganged multi-circuit current sensor 200 shown in FIG. 3 includes a split ferrite core half 312 proximal to the first opening 210, a split ferrite core half 322 proximal to the second opening 220, and a split ferrite core half 332 proximal to the third opening 230. In some embodiments the ferrite core halves 312, 322, 332 are completely encased in an enclosure for the second component 202 but in other embodiments, a structure of the second component 202 may expose some portion of the ferrite core halves 312, 322, 332, such as the outer surface facing the first component 201 and may allow the ferrite core halves 311, 321, 331 of the first component 201 to actually come in contact with the ferrite core halves 312, 322, 332 of the second component 202.

Other embodiments may utilize Rogowski coils instead of split-core ferrite current sensors. The Rogowski coils may be split into two halves with a connector between the two components to allow the two halves of the Rogowski coils to be electrically connected. In embodiments, Rogowski coils may be created using any physical implementation, including, but not limited to, using twisted wires or as features on a printed circuit board (PCB). Other embodiments may utilize flexible Rogowski coils may be used with the flexible portion of the Rogowski coils extending from a single component to wrap around conductors of the circuits to be monitored. Ganged current sensors using flexible Rogowski coils may be integrated into a single component without a second component housing a portion of the current sensors.

The ferrite core halves 312, 322, 332 of the second component 202 (or the Rogowski coils if used in place of the ferrite core current sensors) are respectively coupled to current sense circuits 310, 320, 330 which may be used to sense the current flowing in conductors passing through the adjacent openings 210, 220, 230. The first sense circuit 310 includes resistor 316 and coil 314 which may be wrapped around ferrite core half 312 adjacent to the first opening 210. The second sense circuit 320 includes resistor 326 and coil 324 which may be wrapped around ferrite core half 322 adjacent to the second opening 220. The third sense circuit 330 includes resistor 336 and coil 334 which may be wrapped around ferrite core half 332 adjacent to the third opening 230. Other embodiments may use different current sensing devices, such as a hall effect sensor, and/or may include different and/or additional electrical components not shown in FIG. 3.

The embodiment of the electronics subsection 370 of the current sensor 200 shown in FIG. 3 includes a processor 371 that is coupled to one or more memory devices 372 which may include volatile memory, non-volatile memory, or a combination thereof, and may include semiconductor devices, magnetic media, optical media, or any other computer-readable media. The memory 372 may be used to store data and or computer program instructions 373 which, when executed by the processor 371 cause a method to be performed by the sensor 200 as described herein.

The electronics subsection 370 also includes a communication interface 374 coupled to the processor 371 for communication with a gateway or other device. The communication interface 374 may be coupled to an antenna 375 for wireless communication with the gateway using any wireless communication protocol, including, but not limited to, Bluetooth, Zigbee®, Z-Wave®, or 6LoWPAN. The communication interface 374 may utilize a wired communication protocol in some embodiments. Any wired communication interface may be used, depending on the embodiment, including, but not limited to, RS-485, USB, RS-232, or I2C and can utilize any protocol, including, but not limited to TCP/IP or ModBus.

An analog multiplexor (mux) 376 and analog-to-digital converter (ADC) 377 are also included in the embodiment computing subsection 370 to allow the processor 371 to measure various voltage levels provided by the sensor subsection 350, although other embodiments may utilize a dedicated ADC for each circuit to be measured, obviating the mux. The processor 371 can control the mux 376 to select which current sense circuit 310, 320, 330 to measure with the ADC 368. Various embodiments of the electronics subsection 360 may support any number of circuits to be measured, depending on the embodiment, and my depend on the number of conductors being monitored by the ganged multi-circuit current sensor 200.

In some embodiments, the current sensor 200 may include pins 212, 222, 232 which extend from the second component 202 to make electrical contact with one or more circuits being monitored by the current sensor 200. In some embodiments, the voltage from the pins 212, 222, 232 may also be coupled to the mux 376 to allow the processor 371 to select those voltages for measurement with the ADC 377. This may allow a voltage amplitude and/or phase to for a particular circuit to be measured by the current sensor 200. In some embodiments, the voltage measurements may be combined with the current measurements for a circuit to calculate an energy usage for the circuit.

The current sensor 202 includes a power supply 378 that provides power to current sensor 202 including power for the processor 371, memory 372, communications interface 374, and ADC 377. The power supply 378 may be coupled to one or more of the pins 212, 222, 232 to allow power from one of the monitored circuits to be used to power the current sensor 202 without any additional wiring. In other embodiments, power may be inductively coupled from one or more conductors positioned in the opening 210, 220, 230. The power may be generated from the sense circuits 310, 320, 330 or may be generated from separate power coils, depending on the embodiment. Because power can only be inductively coupled from the conductors in the openings 210, 220, 230 while current is actually flowing in the conductors, the power supply 378 may include an energy storage device which is charged while current is flowing to allow the stored energy to be used to power the current sensor 202 when no current is flowing in the conductors being monitored.

Figure 4A:
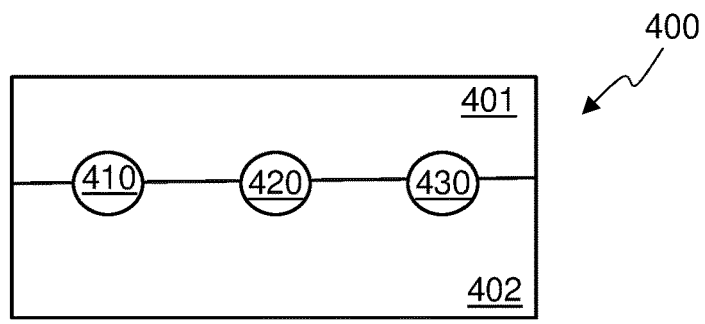
FIGS. 4A, 4B, and 4C show different views of an alternative embodiment of a ganged multi-circuit current sensor.
Figure 4B:
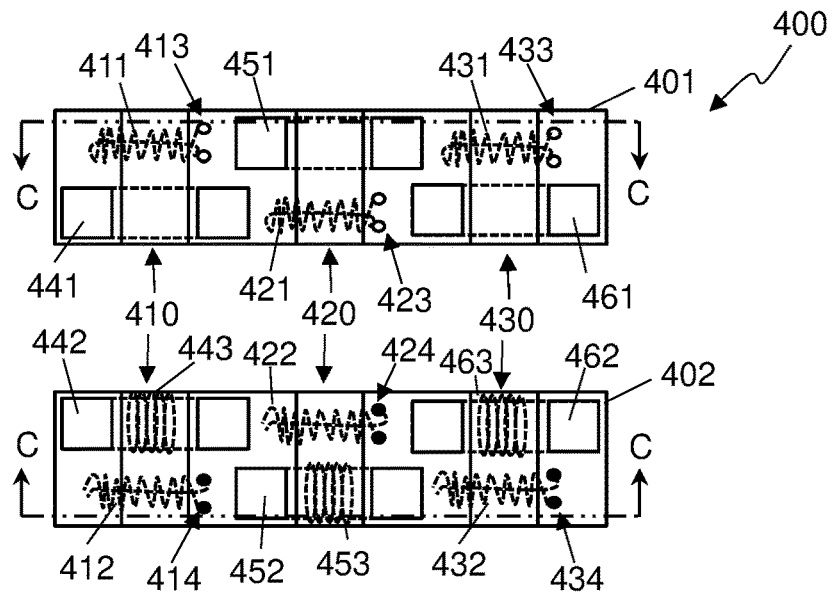
Figure 4C:
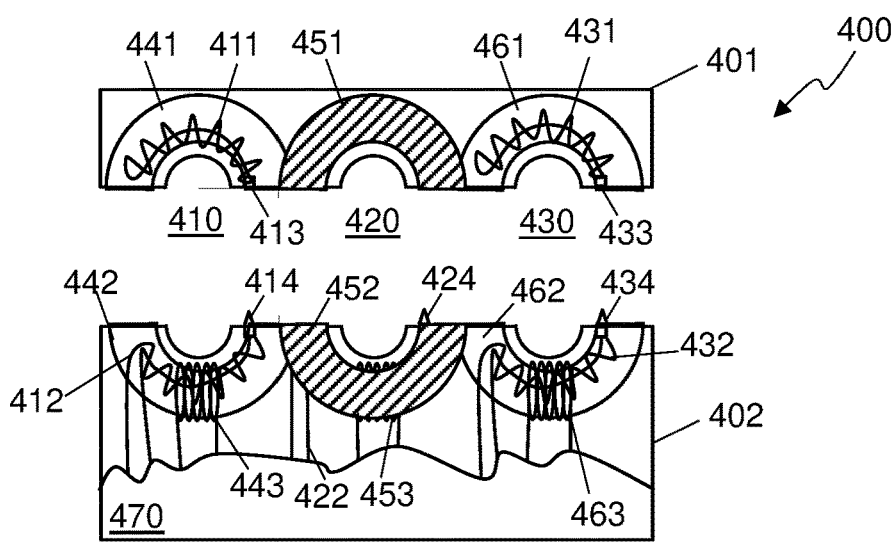

FIGS. 4A, 4B, and 4C show different views of an alternative embodiment of a ganged multi-circuit current sensor 400 that includes a first component 401 and a second component 402. The first component 401 and the second component 402 are shaped to fit together to create a combined unit 400 with a first opening 410, a second opening 420, and a third opening 430, through the combined unit as shown in FIG. 4A. The second component 402 is designed to fit behind a set of conductors emerging from a bank of circuit breakers in a service panel with one conductor in each of the three concave portion of the second component 402. The first component 401 is designed to fit together with the second component 402 to create the openings 410, 420, 430 that respectively surround three separate conductors for three circuits. While three openings 410, 420, 430 are shown in the current sensor 400, other embodiments may have any number of openings, including embodiments having only one opening. The first opening 410, the second opening 420, and the third opening 430 are bounded on the bottom side by the first component 401 and on the top side by the second component 402. The first component 401 and the second component 402 can be held together by any appropriate mechanism, including screws, straps, glue, or clips similar to those shown in FIG. 2A-2C.

The openings 410, 420, 430 are spaced at a pitch (i.e. distance apart) designed to match a particular brand or model of circuit breaker as installed in a service panel. In some embodiments, the pitch may be 1 DIN unit (i.e. 17.5 mm), 27 mm, or any other pitch to match a particular brand or model of circuit breaker. The openings 410, 420, 430 are sized to easily allow a conductor to fit into the openings, such as a 14 AWG (American Wire Gauge) wire for a 15 Amp circuit, a 12 AWG wire for a 20 Amp circuit, a 10 AWG wire for a 30 Amp circuit, or an 8 AWG wire for a 50 Amp circuit. In at least one embodiment, the openings are about 8 mm in diameter to allow an insulated wire between 14 AWG and 6 AWG (inclusive) to fit through the opening. Other embodiments may have different sized openings, depending on the gauge of wire around which they are intended to be installed.

FIG. 4B shows the two components 401, 402 from the perspective of between the two components 401, 402 while FIG. 4C shows the two components as a cross-section from a front side, the cross section taken at the lines C:C as shown in FIG. 4B. Note that elements that would be hidden may be shown in broken lines (such as the partial Rogowski coil 411 in FIG. 4B) and that a device cut in a cross-sectional view is shown with hatch lines (such as split ferrite core half 451 in FIG. 4C). The first component 401 includes a first split ferrite core half 441 proximal to the first side of the first opening 410, a second split ferrite core half 451 proximal to the first side of the second opening 420, and a third split ferrite core half 461 proximal to the first side of the third opening 430. The first component 401 also includes a first partial Rogowski coil 411 proximal to the first side of the first opening 410, a second partial Rogowski coil 421 proximal to the first side of the second opening 420, and a third partial Rogowski coil 431 proximal to the first side of the third opening 430. In embodiments, the partial Rogowski coils 411, 421, 431 may be created using any physical implementation, including, but not limited to, using twisted wires or as features on a printed circuit board (PCB).

A first pair of electrical contacts 413 are positioned on an outer surface of the first component 401 that faces the second component 402 when fitted with the second component 402. The first pair of electrical contacts 413 are electrically connected to the first partial Rogowski coil 411. A second pair of electrical contacts 423 are positioned on the outer surface of the first component 401 that faces the second component 402 when fitted with the second component 402. The second pair of electrical contacts 423 are electrically connected to the second partial Rogowski coil 421. A third pair of electrical contacts 433 are positioned on the outer surface of the first component 401 that faces the second component 402 when fitted with the second component 402. The third pair of electrical contacts 433 electrically connected to the second partial Rogowski coil 431.

The second component 402 includes a fourth split ferrite core half 441 proximal to the second side of the first opening 410, a fifth split ferrite core half 451 proximal to the second side of the second opening 420, and a sixth split ferrite core half 461 proximal to the second side of the third opening 430. When the first component 401 is mated with the second component 402, the first split ferrite core half 411 is put into close proximity, or in physical contact with, the fourth split core half 441, to form a complete ferrite core surrounding the first opening 410. When the first component 401 is mated with the second component 402, the second split ferrite core half 421 is put into close proximity, or in physical contact with, the fifth split core half 451, to form a complete ferrite core surrounding the second opening 420. When the first component 401 is mated with the second component 402, the third split ferrite core half 431 is put into close proximity, or in physical contact with, the sixth split core half 461, to form a complete ferrite core surrounding the third opening 430. A coil 443 is wrapped around the fourth split ferrite core half 442, a second coil 453 is wrapped around the fifth split ferrite core half 452, and a third coil 463 is wrapped around the sixth split ferrite core half 462. This creates energy harvesting circuits (or devices) to allow current flowing in a conductor that passes through an opening 410, 420, 430 to inductively couple through the ferrite core and into the coil of wire to provide power. Thus, an inductive energy harvesting device may include a split-core ferrite current transformer. The first coil 443, the second coil 453, and the third coil 463 all couple to the electronics subsection 470 to provide power to the electronics subsection 470. Depending on the embodiment, the electronics subsection 470 may be physically integrated into the second component 402 or the electronics subsection 470 may be implemented as one or more separate components. Other embodiments may integrate some parts of the electronics subsection 470 into the second component and other parts of the electronics subsection 470 into one or more other components.

The second component 402 includes a fourth partial Rogowski coil 412 proximal to the second side of the first opening 410, a fifth partial Rogowski coil 422 proximal to the second side of the second opening 420, and a sixth partial Rogowski coil 432 proximal to the second side of the second opening 430. A fourth pair of electrical contacts 414 are positioned on an outer surface of the second component 401 to make electrical contact with the first pair of electrical contacts 413 when fitted with the first component 401. The fourth pair of electrical contacts are electrically connected to the third partial Rogowski coil 412. A fourth pair of electrical contacts 414 are positioned on an outer surface of the second component 401 to make electrical contact with the first pair of electrical contacts 413 when fitted with the first component 401. The fourth partial Rogowski coil 412 is electrically connected at one end to the fourth pair of electrical contacts 414 and at the other end to the electronics subsection 470. A fifth pair of electrical contacts 424 are positioned on an outer surface of the second component 401 to make electrical contact with the second pair of electrical contacts 423 when fitted with the first component 401. The fifth partial Rogowski coil 422 is electrically connected at one end to the fifth pair of electrical contacts 424 and at the other end to the electronics subsection 470. A sixth pair of electrical contacts 434 are positioned on an outer surface of the second component 401 to make electrical contact with the third pair of electrical contacts 433 when fitted with the first component 401. The sixth partial Rogowski coil 432 is electrically connected at one end to the sixth pair of electrical contacts 434 and at the other end to the electronics subsection 470.

The mating pairs of electrical contacts 413/414, 423/424, 433/434 can be any sort of electrical contacts that conduct electricity when mated together, such as pin-and-socket connectors, finger edge connections, wiping contacts, or spring-loaded contacts. In at least one embodiment, the pairs of electrical contacts 413, 423, 433 located on the first component 401 include small metal pads that may be made from, or plated with, a non-corrosive metal such as gold, and the pairs of electrical contacts 414, 424, 434 on the second component 402 include spring-loaded probes (which also may be made from or plated with a non-corrosive metal such as gold) that press into the small metal pads to make electrical contact when the first component 401 is mated with the second component 402.

When the first component 401 is mated with the second component 402, causing the first pair of electrical contacts 413 to electrically connect to the fourth pair of electrical contacts 414, the second pair of electrical contacts 423 to electrically connect to the fifth pair of electrical contacts 424, and the third pair of electrical contacts 433 to electrically connect to the sixth pair of electrical contacts 414, a first Rogowski coil, a second Rogowski coil, and a third Rogowski coil are created that respectively wrap around the first opening 410, the second opening 420, and the third opening 430. The first Rogowski coil includes the first partial Rogowski coil 411 located in the first component 401 electrically connected by separable electrical contacts 413, 414 to the fourth partial Rogowski coil 412 located in the second component 402. The second Rogowski coil includes the second partial Rogowski coil 421 located in the first component 401 electrically connected by separable electrical contacts 423, 424 to the fifth partial Rogowski coil 422 located in the second component 402. The third Rogowski coil includes the third partial Rogowski coil 431 located in the first component 401 electrically connected by separable electrical contacts 433, 434 to the sixth partial Rogowski coil 432 located in the second component 402.

A Rogowski coil can be used to measure alternating current in a conductor when the Rogowski coil is wrapped around the conductor. A Rogowski coil may be constructed by coiling a wire around a tube and then passing the wire back through the tube so that both ends of the wire are terminated at the same end of the tube. The partial Rogowski coils 411, 421, 431 in the first component 401 may be constructed this way with the tube positioned around the first wall of the openings 410, 420, 430 and the wires connected to the respective pair of contacts 413, 423, 433. The partial Rogowski coils 412, 422, 423 in the second component may be constructed somewhat differently with a first end of a first wire connected to one of the contacts of the respective pair of contacts 414, 424, 434 and then wrapped around a tube positioned around the second wall of the openings 410, 420, 430. A first end of a second wire is connected to the other contact of the respective pair of contacts 414, 424, 434 and then passes through the tube. The second ends of the two wires may be terminated in circuitry of the second component. Thus a first current sensing device may include a first Rogowski coil, a second current sensing device may include the second Rogowski coil, and a third current sensing device may include the third Rogowski coil.

The combined unit 400 has a breaker-facing side shown in FIG. 4A that includes the first opening 410, the second opening 420, and the third opening 430. In the embodiment shown, the energy harvesting devices are staggered between openings to allow for larger ferrite cores to be used in the limited spacing between the openings 410, 420, 430. In the embodiment of the ganged current sensor 400, the first current sensing device is positioned between the breaker-facing side of the combined unit 400 and the first inductive energy harvesting device where both surround the first opening 410, the second inductive energy harvesting device is positioned between the breaker-facing side of the combined unit and the second current sensing device where both surround the second opening 420, and the third current sensing device is positioned between the breaker-facing side of the combined unit 400 and the third inductive energy harvesting device where both surround the third opening 430.

In some embodiments, a device may be configured to monitor a single circuit instead of multiple circuits, and therefore only have a single opening to allow a conductor to pass through. The device includes two components that mate together to form the single opening through the device to allow the device to be mounted on a conductor without disconnecting the conductor from the breaker. The device includes an inductive energy harvesting device and a current sensing device, both mounted around the opening. The inductive energy harvesting device and the current sensing device may be positioned serially at two places along the opening, or they may be positioned concentrically with one located inside of the other at the same place along the opening. The inductive energy harvesting device may include a split ferrite core current transformer and the current sensing device may include a flexible Rogowski coil or a two-part Rogowski coil as described above.

Figure 4D:
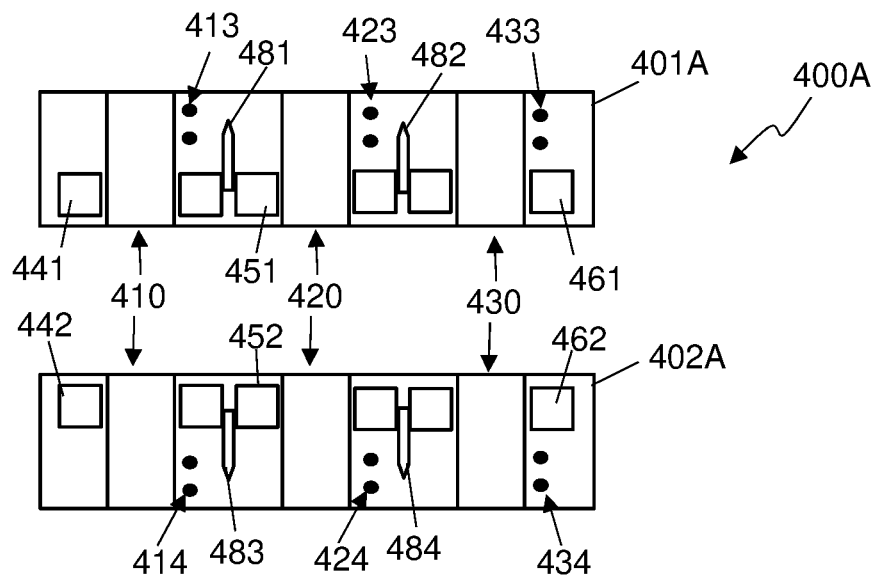
FIGS. 4D and 4E show different views of another alternative embodiment of a ganged multi-circuit current sensor.
Figure 4E:
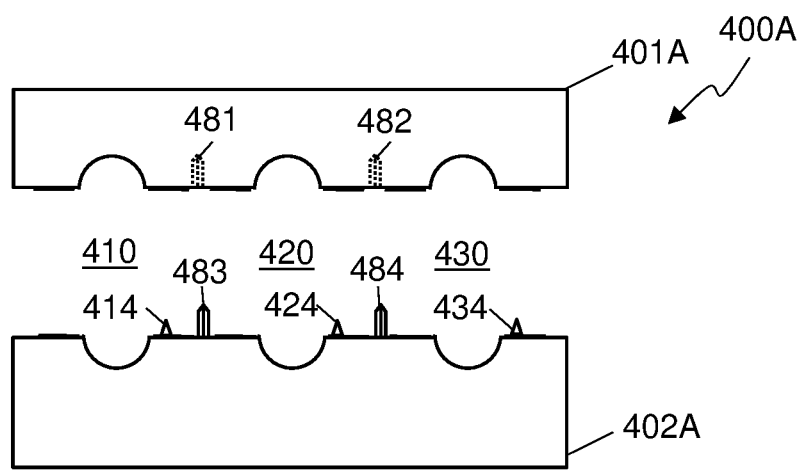

FIGS. 4D and 4E show different views of another alternative embodiment of a ganged multi-circuit current sensor 400A that includes a first component 401A and a second component 402A. FIG. 4D shows the two components 401A, 402A from the perspective of between the two components 401A, 402A while FIG. 4E shows a front side elevational view of the two components 401A, 402A. The first component 401A and the second component 402A are shaped to fit together to create a combined unit 400A with a first opening 410, a second opening 420, and a third opening 430, through the combined unit 400A. All of the openings 410, 420, 430 are bounded on a first side by the first component 401A and on a second side by the second component 402A.

The first component 401A includes a first portion 441 of a first inductive energy harvesting device proximal to the first side of the first opening 410 and a first portion of a first current sensing device (hidden from view in FIG. 4D/E but connected to the first pair of electrical contacts 413), different than the first inductive energy harvesting device, proximal to the first side of the first opening 410. A first portion 451 of a second inductive energy harvesting device proximal to the first side of the second opening 420 and a first portion of a second current sensing device (hidden from view in FIG. 4D/E but connected to the second pair of electrical contacts 423), different than the second inductive energy harvesting device, proximal to the first side of the second opening 420 is also included in the first component 401A. In addition, the first component 401A includes a first portion 461 of a third inductive energy harvesting device proximal to the first side of the third opening 430 and a first portion of a third current sensing device (hidden from view in FIG. 4D/E but connected to the third pair of electrical contacts 433), different than the third inductive energy harvesting device, proximal to the first side of the third opening 430.

The second component 402A includes a second portion 442 of the first inductive energy harvesting device proximal to the second side of the first opening 410 and a second portion of the first current sensing device (hidden from view in FIG. 4D/E but connected to the fourth pair of electrical contacts 414), proximal to the second side of the first opening 410. The second component 402A also includes a second portion 452 of the second inductive energy harvesting device proximal to the second side of the second opening 420 and a second portion of second current sensing device (hidden from view in FIG. 4D/E but connected to the fifth pair of electrical contacts 424), proximal to the second side of the second opening 420. In addition, the second component 402A includes a second portion 462 of the second inductive energy harvesting device proximal to the second side of the third opening 430 and a second portion of third current sensing device (hidden from view in FIG. 4D/E but connected to the sixth pair of electrical contacts 434), proximal to the second side of the third opening 430.

The combined unit 400A has a breaker-facing side (similar to that shown in FIG. 4A) that includes the first opening 410, the second opening 420, and the third opening 430. In the embodiment shown, the current sensing devices are located between the energy harvesting devices and the breaker-facing side of the combined unit 400A. Thus, in the embodiment of the ganged current sensor 400A, the first current sensing device is positioned between the breaker-facing side of the combined unit 400 and the first inductive energy harvesting device where both surround the first opening 410, the second current sensing device is positioned between the breaker-facing side of the combined unit and the second inductive energy harvesting device where both surround the second opening 420, and the third current sensing device is positioned between the breaker-facing side of the combined unit 400 and the third inductive energy harvesting device where both surround the third opening 430. In some embodiments, the inductive energy harvesting devices may be located between the breaker-facing side of the combined unit and the current sensing devices. In yet other embodiments, the inductive energy harvesting devices and the current sensing devices may be positioned concentrically, with one inside of the other, so that they are approximately the same distance from the breaker-facing side of the combined unit.

The ganged multi-circuit current sensor 400A may utilize split-core ferrite current transformers for the inductive energy harvesting devices although other embodiments may use a different type of inductive energy harvesting devices. A multi-part Rogowski coil as described for sensor 400 above may be used for the current sensing devices although other embodiments may use a different type of current sensing devices. In some embodiments, split-core ferrite current transformers may be used for both the inductive energy harvesting devices and the current sensing devices. In other embodiments, multi-part Rogowski coils may be used for both the inductive energy harvesting devices and the current sensing devices.

The first component 401A includes a first keying socket 481 and second keying socket 482 that are cavities in the side of the first component 401A that faces the second component 402A when mated. The keying sockets 481, 482 may be shaped so that a similarly shaped key can only fit into the keying sockets 481, 482 in one orientation. In some embodiments, the first keying socket 481 may have a different size and/or shape that the second keying socket 482.

The second component 402A includes a first key 483 and a second key 484 extending from the side of the second component that faces the first component 401A when mated. The first key 483 and the second key 484 are shaped to respectively fit into the first keying socket 481 and the second keying socket 482 when the first component 401A is mated with the second component 402A. The keys 483, 484 may be designed to make difficult to touch an exposed surface of one split ferrite core half to another exposed surface of a split ferrite core half of a different energy harvesting device.

Figure 4F:
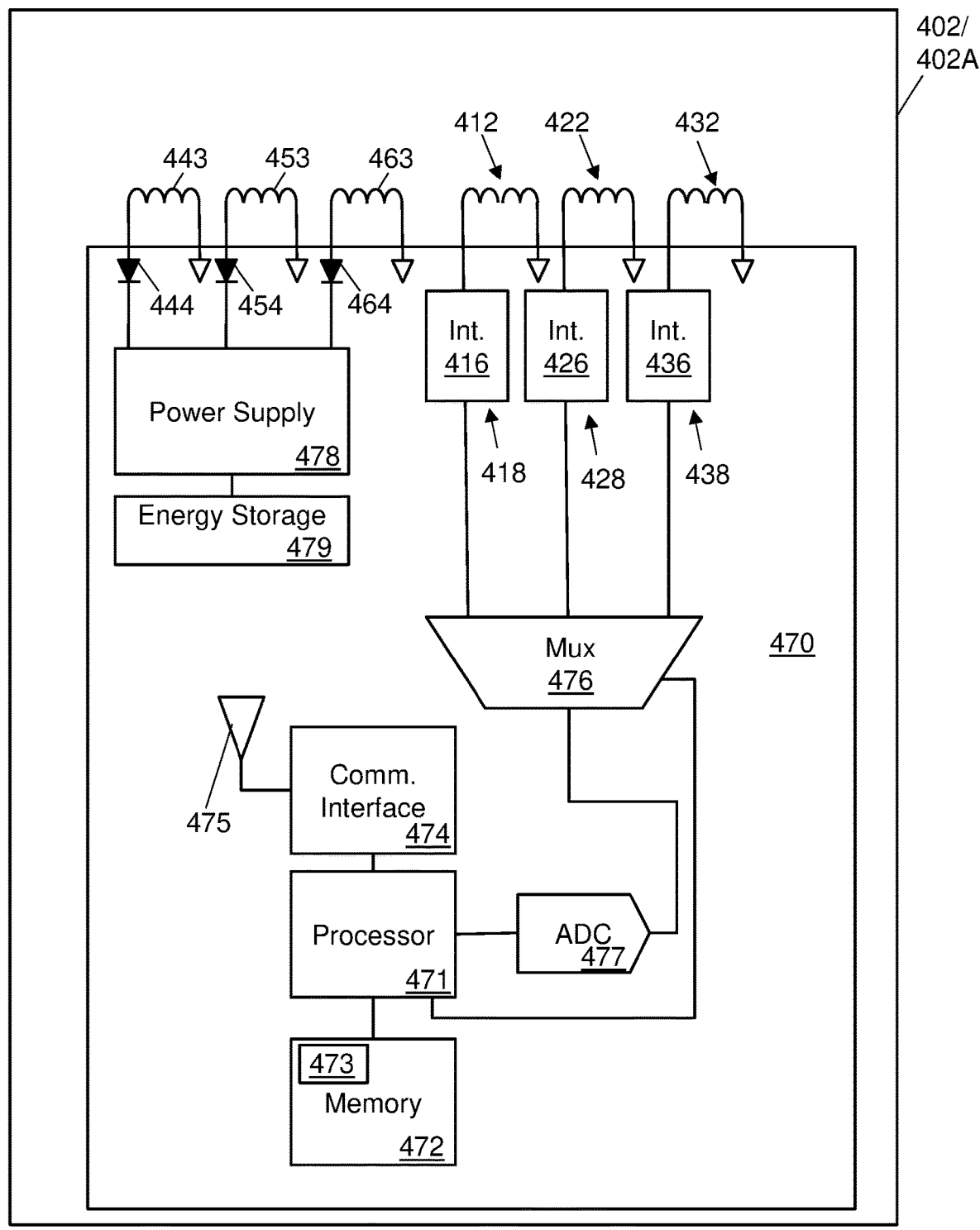
FIG. 4F shows a block diagram of a second component of the embodiments of a ganged multi-circuit sensor shown in FIG. 4A-E.

FIG. 4F shows a block diagram of a second component 402/402A of the embodiments of a ganged multi-circuit sensors 400/400A shown in FIG. 4A-D. Note that because the differences between the sensor 400 and the sensor 400A are mechanical, the electrical block diagram shown in FIG. 4F may be used for either the sensor 400 or the sensor 400A.

As described above, the second component 402/402A includes the first coil 443 of the first inductive energy harvesting device coupled to the power supply 478 through diode 444, the second coil 453 of the second inductive energy harvesting device coupled to the power supply 478 through diode 454, and the third coil 463 of the third inductive energy harvesting device coupled to the power supply 478 through diode 464. Ends of the coils 463, 453, 463 opposite of the ends respectively connected to the diodes 444, 454, 464 may be grounded, although other circuit configurations may be used by other embodiments. The power supply 478 is configured to provide power to various components of the electronics subsection 470 and/or charge the energy storage device 479 using power received from one or more of the inductive energy harvesting devices.

The energy storage device 479 may include a rechargeable battery of any type or chemistry, including, but not limited, to lead-acid, nickel metal hydride, and lithium-ion. Alternatively or in addition, the energy storage device 479 may include a "super capacitor" (i.e. a capacitor that uses electrostatic double-layer capacitance and/or electrochemical pseudo-capacitance). The energy storage device 479 is selected to have a storage capacity large enough to power the electronics subsection 470 for an anticipated duration of time that no power is available from the inductive energy harvesting devices. This may be a 24 hour period, a 12 hour period, or any other appropriate time period. A typical or maximum power drawn by the electronics subsection 470 may be used to calculate a storage capacity for the energy storage device 479. So as a non-limiting example, if the electronics subsection 470 has an average power consumption of 1 milli-Ampere (mA) at 3 Volts (V), which is 3 milli-Watts (mW), and it is anticipated that the longest period of time that all of the monitored circuits will be inactive causing the inductive energy harvesting devices to be incapable of providing power will be 1 week, the energy storage device 479 may be selected to provide at least 168 mA-hours (mAh) at 3 V. If the energy storage device 479 has a voltage level different than the voltage used by components in the electronics subsection 470, then an efficiency of a DC-to-DC converter in the power supply 478 may also be taken into consideration. So for example if the DC-to-DC converter has a 90% efficiency and the energy storage device 479 is a 7.6 V lithium-ion battery, a capacity of at least 60 mA-hours may be selected (90%×168 mAh×3 V/7.6 V).

In some embodiments the power supply 478 may be further configured to determine whether power is available from at least one of the inductive energy harvesting devices and change its operation dependent on that. The power supply 478 may also provide an indication of whether power is available from at least one of the inductive energy harvesting devices to the processor 471. The inducting energy harvesting devices may not be able to provide power due to loads connected to the circuits being monitored being shut off as an inductive energy harvesting device cannot harvest energy if no current is flowing in the conductor to which it is coupled.

In response to determining that power is available from at least one of the inductive energy harvesting devices, the power supply 478 may provide power to all or part of the electronics subsection 470, such as the processor 471. The power supply 478 may also ascertain whether the energy storage device 479 is able to accept energy and provide power to the energy storage device 479 from one or more of the inductive energy harvesting devices in response to ascertaining that the energy storage device 479 is able to accept energy. The power supply 478 may provide power to the processor 471 (and/or other components of the electronics subsection 470) from the energy storage device 479 upon determining that power is not available from any of the inductive energy harvesting devices at a particular point in time.

The second component 402/402A also includes a first current sense circuit 418 that includes the fourth partial Rogowski coil 412 and may include other circuitry, such as the integrator circuit 416. A second current sense circuit 428 that includes the fifth partial Rogowski coil 422 and may include other circuitry, such as the integrator circuit 426, and a third current sense circuit 438 that includes the sixth partial Rogowski coil 432 and may include other circuitry, such as the integrator circuit 436 are also included in the second component 402/402A.

The embodiment of the electronics subsection 470 of the second component 402/402A includes a processor 471 that is coupled to one or more memory devices 472 which may include volatile memory, non-volatile memory, or a combination thereof, and may include semiconductor devices, magnetic media, optical media, or any other computer-readable media. The memory 472 may be used to store data and or computer program instructions 473 which, when executed by the processor 471 cause a method to be performed by the sensor 400/400A as described herein.

The electronics subsection 470 also includes a communication interface 474 coupled to the processor 471 for communication with a gateway or other device. The communication interface 474 may be coupled to an antenna 475 for wireless communication with the gateway using any wireless communication protocol, including, but not limited to, Bluetooth, Zigbee, Z-Wave, or 6LoWPAN. The communication interface 474 may utilize a wired communication protocol in some embodiments. Any wired communication interface may be used, depending on the embodiment, including, but not limited to, RS-485, USB, RS-232, or I2C and can utilize any protocol, including, but not limited to TCP/IP or ModBus.

An analog mux 476 and ADC 477 are also included in the embodiment computing subsection 470 to allow the processor 471 to measure various voltage levels provided by the current sensors 418, 428, 438, although other embodiments may utilize a multiple ADCs in place of the mux 476. The processor 471 can control the mux 476 to select which current sensing device (or circuit) 418, 428, 438 to measure with the ADC 477.

Thus, the processor 471 is coupled to the first current sensing device 418, the second current sense circuit 428, and the third current sensing device 438. The processor 471 may be programmed to take a first current measurement using the first current sense circuit 418, a second current measurement using the second current sense circuit 428, and a third current measurement using the third current sense circuit 438, and to send the first current measurement, the second current measurement, and the third current measurement over a wireless communication network though the antenna 475 using the communications interface 474. The first current measurement, the second current measurement, and the third current measurement may be any type of current measurement including a magnitude or phase measurement.

In some embodiments the processor 471 may be programmed to take the current measurements repeatedly at a rate that changes depending on at least one parameter. Any type of parameter may be used to determine a rate for taking the current measurements, including, but not limited to a prior reading of a current measurement, an indication from the power supply 478 that power is not available from any of the inductive energy harvesting devices, an indication from the power supply 478 of how much energy is being currently harvested from the inductive energy harvesting devices, a charge indication from the power supply 478 for the energy storage device 479, some other indication from the power supply 478, a time of day, or any combination thereof. So in at least one embodiment, the processor 471 may take current measurements at a relatively fast rate as long as the power supply 478 indicates that there is power being received from the inductive energy harvesting devices, but then change to a slower rate in response to an indication that power is being received from the energy storage device 479. The processor 471 may stop taking current measurements if the power supply 478 indicates that a charge level of the energy storage device 479 is low to ensure that communication through the communications interface 474 is still possible.

Note that while FIG. 4A-F show a ganged current sensor, some embodiments may be designed to monitor a single circuit. In such an embodiment, the combined unit may include a single opening with the first component and the second component are configured to be fitted together around a current-carrying conductor positioned to pass through the opening. The first component and the second component may be completely separate units, or the first component may be hingedly attached to the second component with an axis of rotation of the hinge substantially parallel to an axis of the opening. The first component may include a first portion of an inductive energy harvesting device and a first portion of a current sensing device, both proximal to the first side of the opening. The second component may include a second portion of the inductive energy harvesting device and a second portion of the current sensing device, both proximal to the second side of the opening.

Any type of current sensing device may be used in embodiments, but in some embodiments the first portion of the current sensing device includes a first partial Rogowski coil coupled to a first set of electrical contacts and the second portion of the current sensing device includes a second partial Rogowski coil coupled to a second set of electrical contacts. The second set of electrical contacts are configured to be electrically coupled to the first set of electrical contacts when the first component and the second component are fitted together. The first partial Rogowski coil may be implemented using a first multi-layer printed circuit board (PCB) and the second partial Rogowski coil may be implemented a second multi-layer PCB.

Any type of inductive energy harvesting device may be used in embodiments. In some embodiments the first portion of the inductive energy harvesting device includes a first split ferrite core half, and the second portion of the inductive energy harvesting device includes a second split ferrite core half.

The single circuit sensor may include an energy storage device, such as, but not limited to, a rechargeable battery, and a power supply, coupled to the inductive energy harvesting device, configured to charge the energy storage device using power received from the inductive energy harvesting device. It also may include a processor, coupled to the current sensing device, programmed to take a current measurement using the current sensing device and send the current measurement over a wireless communication network. The current measurement may be a magnitude or phase measurement of the current flowing in the current-carrying conductor positioned in the opening. The wireless communication network can be any type of wireless communication network but may be a Bluetooth network in some embodiments. The processor in some implementations my take the current measurement repeatedly at a rate that changes depending on at least one parameter. This may be done for power management reasons. The at least one parameter can be any pertinent parameter, including, but not limited to, a prior reading of the current measurement, an indication from the power supply that power is not available from the inductive energy harvesting device, a charge indication of the energy storage device, a time of day, or any combination thereof.

Figure 5A:
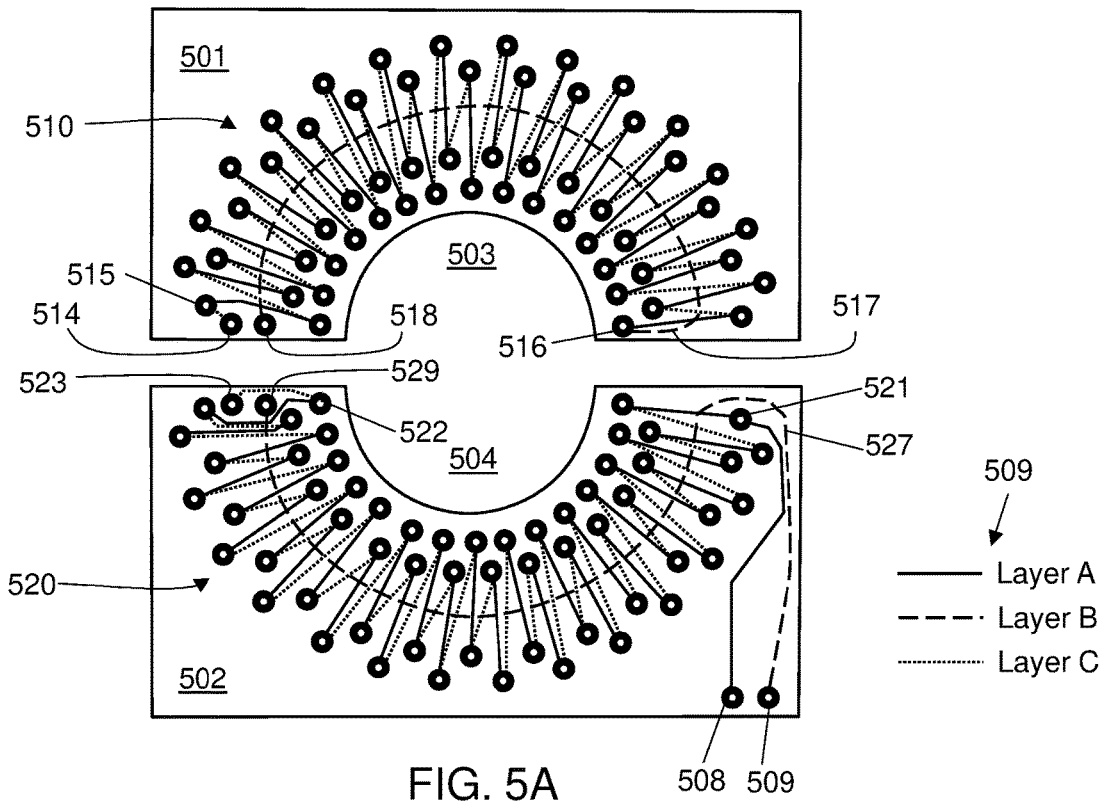
FIG. 5A shows elements of an embodiment of a printed circuit board (PCB) -based Rogowski coil current sensor.

FIG. 5A shows elements of an embodiment of a printed circuit board (PCB) -based Rogowski coil current sensor. The sensor includes a first PCB 501 which creates a first partial Rogowski coil 510, and a second PCB 502 which creates a second partial Rogowski coil 520. The first PCB 501 includes a semi-circular cutout 503 and the second PCB 502 also includes semi-circular cutout 504 which, when the two PCBs 501, 502 are positioned adjacent to each other, create an opening suitable to surround a current-carrying conductor. Both the first PCB 501 and the second PCB 502 are multi-layer PCBs. The legend 509 shows that different line types are used to show conductors on different layers of the PCBs 501, 502, so that a solid line represents a conductor on layer A, a dashed line represents a conductor on layer B, and a dotted line represents a conductor on layer C. In at least some embodiments, layer B may be positioned between layer A and layer C. The PCBs 501, 502 may include additional layers in some embodiments that may not include conductors in the areas of the partial Rogowski coils 510, 520 or may include electrical shielding on outer layers.

The annular shapes represent through-holes of the PCBs 501, 502 that allow a conductor on one layer to connect to a conductor on a different layer through the through-hole. Note that both the first partial Rogowski coil 510 and the second partial Rogowski coil 520 include four rings of through-holes. The first ring is the ring closest to the cutouts 503, 504, the second ring is farther from the cutouts 503, 504 than the first ring, the third ring is farther from the cutouts 503, 504 than the second ring, and the fourth ring is the farthest from the cutouts 503, 504.

The second partial Rogowski coil 520 is electrically connected to a pair of electrical contacts 508, 509 which may be connected to an electronics section of the current sensor as shown in FIG. 4F. A first electrical contact 508 is connected to the start of the Rogowski coil at the first through-hole 521 of the third ring. An electrical conductor on layer A connects the first through-hole 521 of the third ring to the first through-hole of the first ring which connects to an electrical conductor on layer C. The conductor on layer C connects the first through-hole of the first ring to the first through-hole of the fourth ring where it connects to another conductor on layer A. That conductor on layer A connects the first through-hole of the fourth ring to the first through-hole of the second ring where it connects to another conductor on layer C. That conductor on layer C connects the first through-hole of the second ring to the second through-hole of the third ring. This repeats around the rings of through-holes until the final through-hole 522 of the first ring in the second partial Rogowski coil 520. A conductor on layer C connects the final through hole 522 of the first ring to an electrical contact 523. In addition, a conductor on layer B connects electrical contact 529 to electrical contact 509, travelling through the second partial Rogowski coil 520.

An electrical contact 514 on the first PCB is connected to the first through-hole of the third ring of the first partial Rogowski coil 510 and the first partial Rogowski coil 510 is formed on the first PCB 501 similarly to way that the second partial Rogowski coil 520 is formed on the second PCB 502 with conductors on layer A and layer C connecting through the through-holes of the four rings of through-holes. The first partial Rogowski coil 510 terminates at the final through-hole 516 of the first ring where it connects to a conductor 517 on layer B. The conductor 517 travels back around through the first partial Rogowski coil 510 to electrical contact 518.

The two PCBs 501, 502 can be used to create a current sensing device by mounting a first connector on the electrical contacts 514, 518 of the first PCB and mounting a second connector on the electrical contacts 523, 529 where the first connector and the second connector are configured to mate with each other respectively electrically connect electrical contact 523 to electrical contact 514, and electrical contact 529 to electrical contact 518. By positioning the first PCB 501 adjacent to the second PCB 502 and mating the first connector to the second connector, a Rogowski coil is created from the first partial Rogowski coil 510 and the second partial Rogowski coil 520 that is connected to the pair of electrical contacts 508, 509 which may be coupled to current sensing circuitry to create a current sensing device. This can be accomplished by mounting the first PCB 501 in a first component of a current sensor and the second PCB 502 a second component of the current sensor so that when the first component and the second component are fitted together to create a combined unit, a Rogowski coils is created that can be used as a part of a current sensing device.

Note that the exact routing patterns shown in FIG. 5A are for example only and many other routing patterns may be used in various embodiments. While the pattern shown may be referred to as a saw blade pattern with the conductors on layer A having a radial orientation to the current-carrying conductor and the conductors on layer C oriented at an angle to the radial direction, other embodiments may use a triangle pattern with all of the conductors oriented at an angle to the radial direction or a fishbone pattern where all of the conductors are substantially radially oriented with jog in the conductor on one layer to go from one set of through-holes to the next. Other embodiments may use only two rings of through-holes instead of the four rings shown in FIG. 5A.

Figure 5B:
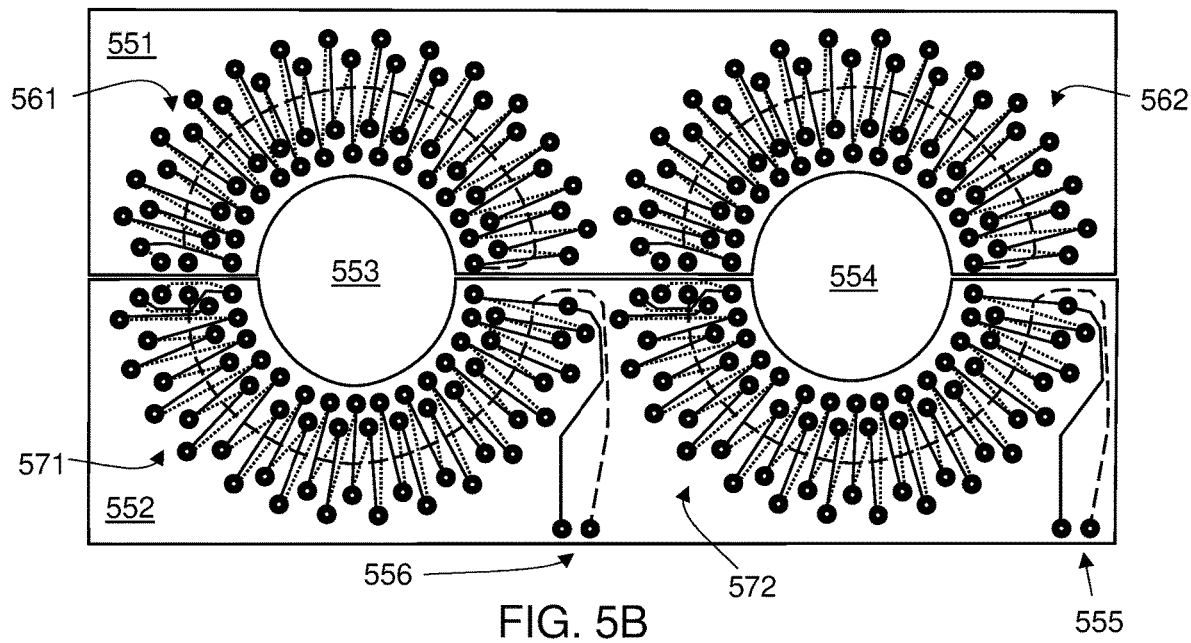
FIG. 5B shows elements of an embodiment of a dual PCB-based Rogowski coil current sensor.

FIG. 5B shows elements of an embodiment of a dual PCB-based Rogowski coil current sensor that includes a first PCB 551 and a second PCB 552. The first PCB 551 and the second PCB 552 each have cutouts to create a first opening 553 and a second opening when the two PCBs 551, 552 are adjacent to each other as shown. The first PCB 551 includes two separate partial Rogowski coils 561, 562 that may be similar to the first partial Rogowski coil 510 of FIG. 5A. The second PCB 552 includes two separate partial Rogowski coils 571, 572 that may be similar to the first partial Rogowski coil 520 of FIG. 5A. The partial Rogowski coils 571, 572 are respectively electrically coupled to a first set of electrical contacts 556 and a second set of electrical contacts 565. Connectors can be mounted on the two PCBs 551, 552 to connect partial Rogowski coil 561 to partial Rogowski coil 571 to create a first Rogowski coil and to connect partial Rogowski coil 562 to partial Rogowski coil 572 to create a second Rogowski coil. The first PCB 551 may be mounted in a first component of a current sensor and the second PCB 552 may be mounted in a second component of the current sensor so that when the first component and the second component are fitted together to create a combined unit, two independent Rogowski coils are created that can be used as a part of two current sensing devices.

Figure 6A:
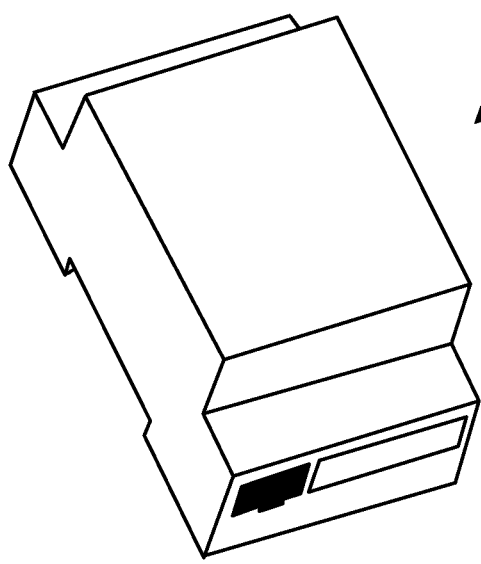
FIGS. 6A and 6B show different views of an embodiment of a submetering gateway.
Figure 6B:
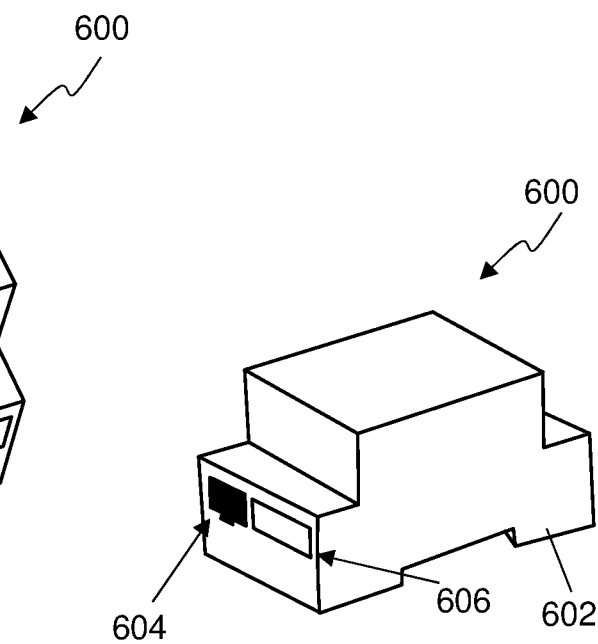

FIGS. 6A and 6B show different views of an embodiment of a submetering gateway 600 from two different perspectives. The submetering gateway 600 shown is designed to mount directly on a bus bar of a service panel and make electrical contact with the bus bar with contact 602. The submetering gateway 600 also includes an Ethernet connector 604 for connection to an external computer and connections 606 to connect to wired current sensors.

Figure 6C:
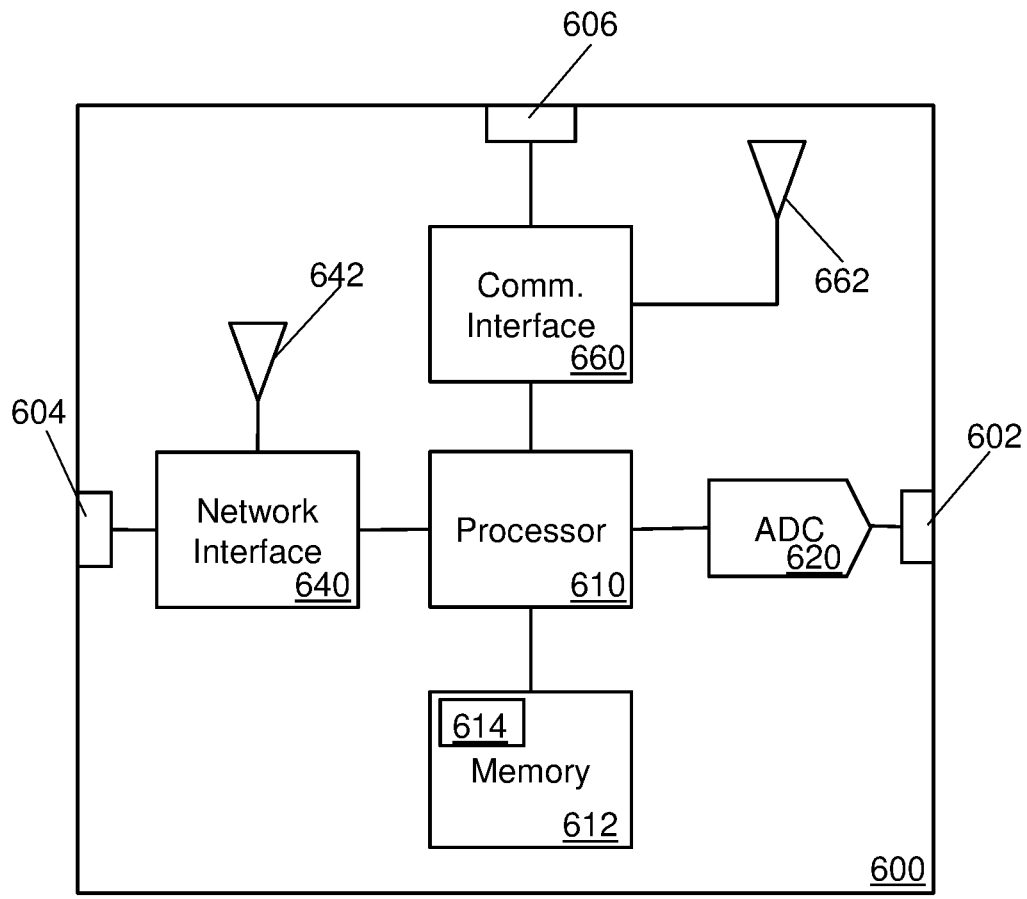
FIG. 6C is a block diagram of the embodiment of the embodiment of the submetering gateway.

FIG. 6C is a block diagram of the embodiment of the embodiment of the submetering gateway 600. The gateway 600 includes a processor 610 coupled to one or more memory devices 612 which may include volatile memory, non-volatile memory, or a combination thereof, and may include semiconductor devices, magnetic media, optical media, or any other computer-readable media. The memory 612 may be used to store data and or computer program instructions 614 which, when executed by the processor 610 cause a method to be performed by the gateway 600.

The gateway 600 also includes a communication interface 660 coupled to the processor 610 for communication with one or more current sensors such as the current sensor 200 described above. The communication interface 660 may couple to an antenna 662 for wireless communication with the current sensors using any wireless communication protocol, including, but not limited to, Bluetooth, Zigbee, Z-Wave, or 6LoWPAN. The communication interface 660 may include a connector 606 for a wired communication protocol in some embodiments. Any wired communication interface may be used, depending on the embodiment, including, but not limited to, RS-485, USB, RS-232, or I2C and can utilize any protocol, including, but not limited to TCP/IP or ModBus.

The gateway 600 also includes a network interface 640 coupled to the processor 610 to communicate with another computer, such as a server computer or a client computer, which may be in the same premises as the gateway 600 or may be remote, such as a cloud-based server accessed through the internet. The network interface 640 may use any type of protocol, wired or wireless and may couple to a connector 604 or an antenna 642 for the communication. Examples of a communication network that may be used include, but are not limited to, Ethernet, USB, a variant of IEEE 802.11 (i.e. Wi-Fi), 4G/5G cellular protocols, WiMax, or MoCA, In some embodiments the gateway 600 includes an analog-to-digital converter (ADC) 620 which may be coupled to the bus bar connector 602 to take measurements of the voltage within the service panel, such as amplitude and phase. The voltage measurements may be used in conjunction with current measurements received from the current sensors through the communication interface 660 to calculate energy usage for individual circuits. The information received from the current sensors through the communication interface 660, the voltage measurements taken with the ADC 620, and/or data calculated by the gateway 600 may be provided through the network interface 640 to an external computer.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions or by configuration information for a field-programmable gate array (FPGA). These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. Similarly, the configuration information for the FPGA may be provided to the FPGA and configure the FPGA to produce a machine which creates means for implementing the functions/acts specified in the flowchart and/or block diagram block or blocks.

These computer program instructions or FPGA configuration information may be stored in a computer readable medium that can direct a computer, other programmable data processing apparatus, FPGA, or other devices to function in a particular manner, such that the data stored in the computer readable medium produce an article of manufacture including instructions which implement the function/act specified in the flowchart and/or block diagram block or blocks. The computer program instructions or FPGA configuration information may also be loaded onto a computer, FPGA, other programmable data processing apparatus, or other devices to cause a series of operational steps to be performed on the computer, FPGA, other programmable apparatus, or other devices to produce a computer implemented process for implementing the functions/acts specified in the flowchart and/or block diagram block or blocks.

The flowchart and/or block diagrams in the figures help to illustrate the architecture, functionality, and operation of possible implementations of systems, methods, and computer program products of various embodiments. In this regard, each block in the flowchart or block diagrams may represent a module, segment, or portion of code comprising one or more executable instructions, or a block of circuitry, for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 7:
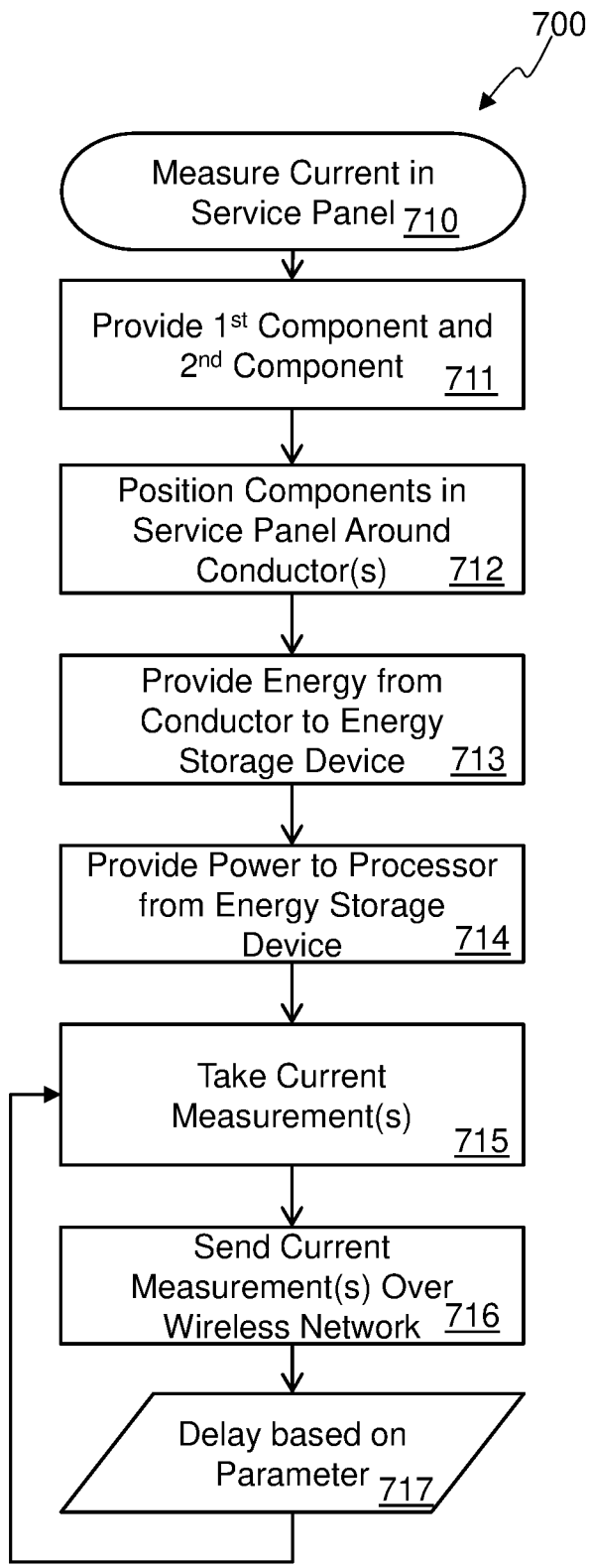
FIG. 7 is a flow chart of a method for measuring current in a service panel.

FIG. 7 is a flow chart 700 of a method for measuring current in a service panel. The method includes providing 711 a first component and a second component configured to fit together to create a combined unit having an opening through the combined unit. Examples of the first component and the second component are described earlier in this disclosure such as those shown in FIG. 3 and FIG. 4A-D, but the method of FIG. 7 is not so limited. The opening of the combined unit is bounded on a first side by the first component and on a second side by the second component. The second component may be separate from, or hingedly attached to, the first component.

The first component includes a first portion of an inductive energy harvesting device proximal to the first side of the opening and the second component includes a second portion of the inductive energy harvesting device proximal to the second side of the opening. The inductive energy harvesting device so formed by the first portion and the second portion of the inductive energy harvesting device can be any type of inductive energy harvesting device, including, but not limited to a ferrite core inductive energy harvesting device made from a first split ferrite core half (i.e. the first portion of the inductive energy harvesting device) and a second split ferrite core half (i.e. the second portion of the inductive energy harvesting device).

The first component also includes a first portion of a current sensing device, different than the inductive energy harvesting device, proximal to the first side of the opening and the second component also includes a second portion of the current sensing device proximal to the second side of the opening. Any type of current sensing device may be used, but in some embodiments the first portion of the current sensing device includes a first partial Rogowski coil coupled to a first set of electrical contacts and the second portion of the current sensing device includes a second partial Rogowski coil coupled to a second set of electrical contacts. The second set of electrical contacts are configured to be electrically coupled to the first set of electrical contacts when the first component and the second component are fitted together. The partial Rogowski coils may be constructed using twisted wire or the first partial Rogowski coil may be implemented as a first multi-layer printed circuit board (PCB) and the second partial Rogowski coil implemented as a second multi-layer PCB.

The method continues with positioning 712 the first component and the second component in a service panel as the combined unit with a current-carrying conductor passing through the opening in the combined unit. This positioning is accomplished while the current-carrying conductor is connected to a breaker in the service panel and a load outside of the service panel. That is the first component and the second component are positioned around the current-carrying conductor without disconnecting the current-carrying conductor from its breaker. In some embodiments the first component and the second component may be positioned around the current carrying conductor in an orientation where the inductive energy harvesting device is positioned between the breaker and the current sensing device.

Some embodiments may utilize a ganged current sensor where the combined unit includes a second opening bounded on a first side by the first component and on a second side by the second component. The first component and the second component of such embodiments are further configured to be fitted together around a second current-carrying conductor positioned to pass through the second opening at the same time that the first current-carrying conductor is positioned to pass through the first opening. Embodiments may use a ganged current sensor where the combined unit includes any number of openings spaced at a breaker pitch for the service panel. Thus, the first component may also include a first portion of a second inductive energy harvesting device proximal to the first side of the second opening, and a first portion of a second current sensing device, different than the second inductive energy harvesting device, proximal to the first side of the second opening. The second component may also include a second portion of the second inductive energy harvesting device proximal to the second side of the second opening and a second portion of the second current sensing device proximal to the second side of the second opening. The first component and the second component may be positioned in the service panel as the combined unit with a second current-carrying conductor passing through the second opening in the combined unit, the positioning accomplished while the second current-carrying conductor is connected to a second breaker in the service panel and a second load outside of the service panel.

Once the combined unit is positioned in the service panel, the method continues with providing energy 713 harvested by the inductive energy harvesting device from current flowing in the current-carrying conductor to an energy storage device. Power 714 is also provided to a processor from the energy storage device. The processor then uses the current sensing device to take a current measurement 715 of the current flowing in the current-carrying conductor and sends the current measurement 716 over a wireless communication network under control of the processor. A delay 717 based on at least one parameter may occur before another current measurement is taken 715. Thus, the processor may take the current measurement repeatedly at a rate that changes depending on at least one parameter. Any parameter may be used to help determine a measurement rate, including, but not limited to, a prior reading of the current measurement, an indication that power is not available from the inductive energy harvesting device, a charge indication of the energy storage device, a time of day, or any combination thereof.

As will be appreciated by those of ordinary skill in the art, aspects of the various embodiments may be embodied as a system, device, method, or computer program product apparatus. Accordingly, elements of the present disclosure may take the form of an entirely hardware embodiment, an entirely software embodiment (including firmware, resident software, micro-code, or the like) or an embodiment combining software and hardware aspects that may all generally be referred to herein as a "apparatus," "server," "circuitry," "module," "client," "computer," "logic," "FPGA," "system," or other terms. Furthermore, aspects of the various embodiments may take the form of a computer program product embodied in one or more computer-readable medium(s) having computer program code stored thereon. The phrases "computer program code" and "instructions" both explicitly include configuration information for an FPGA or other programmable logic as well as traditional binary computer instructions, and the term "processor" explicitly includes logic in an FPGA or other programmable logic configured by the configuration information in addition to a traditional processing core. Furthermore, "executed" instructions explicitly includes electronic circuitry of an FPGA or other programmable logic performing the functions for which they are configured by configuration information loaded from a storage medium as well as serial or parallel execution of instructions by a traditional processing core.

Any combination of one or more computer-readable storage medium(s) may be utilized. A computer-readable storage medium may be embodied as, for example, an electronic, magnetic, optical, electromagnetic, infrared, or semiconductor system, apparatus, or device, or other like storage devices known to those of ordinary skill in the art, or any suitable combination of computer-readable storage mediums described herein. In the context of this document, a computer-readable storage medium may be any tangible medium that can contain or store a program and/or data for use by or in connection with an instruction execution system, apparatus, or device. Even if the data in the computer-readable storage medium requires action to maintain the storage of data, such as in a traditional semiconductor-based dynamic random access memory, the data storage in a computer-readable storage medium can be considered to be non-transitory. A computer data transmission medium, such as a transmission line, a coaxial cable, a radio-frequency carrier, and the like, may also be able to store data, although any data storage in a data transmission medium can be said to be transitory storage. Nonetheless, a computer-readable storage medium, as the term is used herein, does not include a computer data transmission medium.

Computer program code for carrying out operations for aspects of various embodiments may be written in any combination of one or more programming languages, including object oriented programming languages such as Java, Python, C++, or the like, conventional procedural programming languages, such as the "C" programming language or similar programming languages, or low-level computer languages, such as assembly language or microcode. In addition, the computer program code may be written in VHDL or another hardware description language to generate configuration instructions for an FPGA or other programmable logic. The computer program code if converted into an executable form and loaded onto a computer, FPGA, or other programmable apparatus, produces a computer implemented method. The instructions which execute on the computer, FPGA, or other programmable apparatus may provide the mechanism for implementing some or all of the functions/acts specified in the flowchart and/or block diagram block or blocks. In accordance with various implementations, the computer program code may execute entirely on the user's device, partly on the user's device and partly on a remote device, or entirely on the remote device, such as a cloud-based server. In the latter scenario, the remote device may be connected to the user's device through any type of network, including a local area network (LAN) or a wide area network (WAN), or the connection may be made to an external computer (for example, through the Internet using an Internet Service Provider). The computer program code stored in/on (i.e. embodied therewith) the non-transitory computer-readable medium produces an article of manufacture.

The computer program code, if executed by a processor, causes physical changes in the electronic devices of the processor which change the physical flow of electrons through the devices. This alters the connections between devices which changes the functionality of the circuit. For example, if two transistors in a processor are wired to perform a multiplexing operation under control of the computer program code, if a first computer instruction is executed, electrons from a first source flow through the first transistor to a destination, but if a different computer instruction is executed, electrons from the first source are blocked from reaching the destination, but electrons from a second source are allowed to flow through the second transistor to the destination. So a processor programmed to perform a task is transformed from what the processor was before being programmed to perform that task, much like a physical plumbing system with different valves can be controlled to change the physical flow of a fluid.

Examples of various embodiments are described in the following paragraphs:

Embodiment 1. A method for measuring current in a service panel, the method comprising: providing a first component and a second component configured to fit together to create a combined unit having an opening through the combined unit, the opening bounded on a first side by the first component and on a second side by the second component, the second component separate from, or hingedly attached to, the first component; the first component comprising a first portion of an inductive energy harvesting device proximal to the first side of the opening, and a first portion of a current sensing device, different than the inductive energy harvesting device, proximal to the first side of the opening, and the second component comprising a second portion of the inductive energy harvesting device proximal to the second side of the opening and a second portion of the current sensing device proximal to the second side of the opening, positioning the first component and the second component in a service panel as the combined unit with a current-carrying conductor passing through the opening in the combined unit, the positioning accomplished while the current-carrying conductor is connected to a breaker in the service panel and a load outside of the service panel; providing energy harvested by the inductive energy harvesting device from current flowing in the current-carrying conductor to an energy storage device; providing power to a processor from the energy storage device; taking a current measurement of the current flowing in the current-carrying conductor under control of the processor using the current sensing device; and sending the current measurement over a wireless communication network under control of the processor.

Embodiment 2. The method of embodiment 1, the first portion of the current sensing device comprising a first partial Rogowski coil coupled to a first set of electrical contacts; and the second portion of the current sensing device comprising a second partial Rogowski coil coupled to a second set of electrical contacts configured to be electrically coupled to the first set of electrical contacts when the first component and the second component are fitted together.

Embodiment 3. The method of embodiment 2, the first partial Rogowski coil comprising a first multi-layer printed circuit board (PCB) and the second partial Rogowski coil comprising a second multi-layer PCB.

Embodiment 4. The method of any of embodiments 1 through 3, the first portion of the inductive energy harvesting device comprising a first split ferrite core half and the second portion of the inductive energy harvesting device comprising a second split ferrite core half.

Embodiment 5. The method of any of embodiments 1 through 4, wherein the combined unit further comprises a second opening bounded on a first side by the first component and on a second side by the second component, wherein the first component and the second component are further configured to be fitted together around a second current-carrying conductor positioned to pass through the second opening; the first component further comprises a first portion of a second inductive energy harvesting device proximal to the first side of the second opening, and a first portion of a second current sensing device, different than the second inductive energy harvesting device, proximal to the first side of the second opening; and the second component further comprises a second portion of the second inductive energy harvesting device proximal to the second side of the second opening and a second portion of the second current sensing device proximal to the second side of the second opening; said positioning further comprising positioning the first component and the second component in the service panel as the combined unit with a second current-carrying conductor passing through the second opening in the combined unit, the positioning accomplished while the second current-carrying conductor is connected to a second breaker in the service panel and a second load outside of the service panel.

Embodiment 6. The method of any of embodiments 1 through 5, further comprising taking the current measurement repeatedly at a rate that changes depending on at least one parameter.

Embodiment 7. The method of embodiment 6, wherein the at least one parameter comprises a prior reading of the current measurement, an indication that power is not available from the inductive energy harvesting device, a charge indication of the energy storage device, a time of day, or any combination thereof.

Embodiment 8. A current sensor comprising: a first component and a second component shaped to fit together to create a combined unit with an opening through the combined unit, the opening bounded on a first side by the first component and on a second side by the second component, wherein the first component and the second component are configured to be fitted together around a current-carrying conductor positioned to pass through the opening; the first component comprising a first portion of an inductive energy harvesting device proximal to the first side of the opening, and a first portion of a current sensing device, different than the inductive energy harvesting device, proximal to the first side of the opening; and the second component comprising a second portion of the inductive energy harvesting device proximal to the second side of the opening and a second portion of the current sensing device proximal to the second side of the opening.

Embodiment 9. The sensor of embodiment 8, wherein the first component is hingedly attached to the second component with an axis of rotation of the hinge substantially parallel to an axis of the opening.

Embodiment 10. The sensor of embodiment 8 or 9, the first portion of the current sensing device comprising a first partial Rogowski coil coupled to a first set of electrical contacts; and the second portion of the current sensing device comprising a second partial Rogowski coil coupled to a second set of electrical contacts configured to be electrically coupled to the first set of electrical contacts when the first component and the second component are fitted together.

Embodiment 11. The sensor of embodiment 10, the first partial Rogowski coil comprising a first multi-layer printed circuit board (PCB) and the second partial Rogowski coil comprising a second multi-layer PCB.

Embodiment 12. The sensor of any of embodiments 8 through 11, the first portion of the inductive energy harvesting device comprising a first split ferrite core half and the second portion of the inductive energy harvesting device comprising a second split ferrite core half.

Embodiment 13. The sensor of any of embodiments 8 through 12, the second component further comprising: an energy storage device; a power supply, coupled to the energy harvesting device, configured to charge the energy storage device using power received from the energy harvesting device; a processor, coupled to the current sensing device, programmed to take a current measurement using the current sensing device and send the current measurement over a wireless communication network.

Embodiment 14. The sensor of any of embodiments 8 through 12, further comprising: an energy storage device; a power supply, coupled to the inductive energy harvesting device, configured to charge the energy storage device using power received from the inductive energy harvesting device; a processor, coupled to the current sensing device, programmed to take a current measurement using the current sensing device and send the current measurement over a wireless communication network.

Embodiment 15. The sensor of embodiment 13 or 14, wherein the current measurement comprises a magnitude or phase measurement.

Embodiment 16. The sensor of any of embodiments 13 through 15, wherein the wireless communication network comprises a Bluetooth network.

Embodiment 17. The sensor of any of embodiments 13 through 16, wherein the processor is further programmed to take the current measurement repeatedly at a rate that changes depending on at least one parameter.

Embodiment 18. The sensor of embodiment 17, wherein the at least one parameter comprises a prior reading of the current measurement, an indication from the power supply that power is not available from the inductive energy harvesting device, a charge indication of the energy storage device, a time of day, or any combination thereof.

Embodiment 19. The sensor of any of embodiments 13 through 18, wherein the power supply is further configured to: provide power to the energy storage device from the inductive energy harvesting device; provide power to the processor from the energy storage device; provide an indication to the processor as to whether power is available from the inductive energy harvesting device.

Embodiment 20. The sensor of any of embodiments 8 through 19, wherein the opening is a first opening, the current-carrying conductor is a first current-carrying conductor, the inductive energy harvesting device is a first inductive energy harvesting device and the current sensing device is a first current sensing device; the combined unit further comprising a second opening bounded on a first side by the first component and on a second side by the second component, wherein the first component and the second component are further configured to be fitted together around a second current-carrying conductor positioned to pass through the second opening; the first component further comprising a first portion of a second inductive energy harvesting device proximal to the first side of the second opening, and a first portion of a second current sensing device, different than the second inductive energy harvesting device, proximal to the first side of the second opening; and the second component further comprising a second portion of the second inductive energy harvesting device proximal to the second side of the second opening and a second portion of the second current sensing device proximal to the second side of the second opening.

Embodiment 21. The sensor of embodiment 20, the first opening and the second opening arranged to match a pitch of circuit breakers in a service panel.

Embodiment 22. The sensor of embodiment 20 or 21, the combined unit having a breaker-facing side that includes the opening; wherein the first inductive energy harvesting device is positioned between the breaker-facing side of the combined unit and the first current sensing device; and the second current sensing device is positioned between the breaker-facing side of the combined unit and the second inductive energy harvesting device.

Embodiment 23. The sensor of any of embodiments 20 through 22, further comprising: an energy storage device; a power supply, coupled to the first inductive energy harvesting device and the second inductive harvesting energy device, configured to charge the energy storage device using power received from the first inductive energy harvesting device and/or the second inductive energy harvesting device; a processor, coupled to the first current sensing device and the second current sensing device, programmed to: take a first current measurement using the first current sensing device, take a second current measurement using the second current sensing device, and send the first current measurement and the second current measurement over a wireless communication network.

Embodiment 24. The sensor of embodiment 23, wherein the first current measurement and the second current measurement respectively comprise a magnitude or phase measurement.

Embodiment 25. The sensor of embodiment 23 or 24, wherein the wireless communication network comprises a Bluetooth network.

Embodiment 26. The sensor of any of embodiments 22 through 25, wherein the processor is further programmed to take the first current measurement repeatedly at a rate that changes depending on at least one parameter.

Embodiment 27. The sensor of embodiment 26, wherein the at least one parameter comprises a prior reading of the first current measurement, a prior reading of the second current measurement, a first indication that power is not available from the first inductive energy harvesting device, a second indication that power is not available from the second inductive energy harvesting device, a third indication of a charge level of the energy storage device, a time of day, or any combination thereof.

Embodiment 28. A current sensor comprising: a first component and a second component shaped to fit together to create a combined unit with a first opening and a second opening through the combined unit, both the first opening and the second opening bounded on a first side by the first component and on a second side by the second component, wherein the first component and the second component are configured to be fitted together around a first current-carrying conductor positioned to pass through the first opening and a second current-carrying conductor positioned to pass through the second opening; the first component comprising: a first split ferrite core half proximal to the first side of the first opening; a second split ferrite core half proximal to the first side of the second opening; a first partial Rogowski coil proximal to the first side of the first opening; a second partial Rogowski coil proximal to the first side of the second opening; a first pair of electrical contacts electrically coupled to the first partial Rogowski coil; a second pair of electrical contacts electrically coupled to the second partial Rogowski coil; and the second component comprising: a third split ferrite core half proximal to the second side of the first opening; a fourth split ferrite core half proximal to the second side of the second opening; a first energy harvesting circuit coupled to the third split ferrite core half; a second energy harvesting circuit coupled to the fourth split ferrite core half; a third partial Rogowski coil proximal to the second side of the first opening; a fourth partial Rogowski coil proximal to the second side of the second opening; a third pair of electrical contacts positioned to make electrical contact with the first pair of electrical contacts when the first component and the second component are fitted together, the third pair of electrical contacts electrically coupled to the third partial Rogowski coil; a fourth pair of electrical contacts positioned to make electrical contact with the second pair of electrical contacts when the first component and the second component are fitted together, the fourth pair of electrical contacts electrically coupled to the fourth partial Rogowski coil; an energy storage device; a power supply, coupled to the first energy harvesting circuit and the second energy harvesting circuit, configured to charge the energy storage device using power received from the first energy harvesting circuit and/or the second energy harvesting circuit; a first current sense circuit comprising the third partial Rogowski coil; a second current sense circuit comprising the fourth partial Rogowski coil; and a processor, coupled to the first current sense circuit and the second current sense circuit, programmed to take a first current measurement using the first current sense circuit and a second current measurement using the second current sense circuit, and to send the first current measurement and the second current measurement over a wireless communication network.

Embodiment 29. A current sensor comprising: a first component and a second component shaped to fit together to create a combined unit with a first opening and a second opening through the combined unit, both the first opening and the second opening bounded on a first side by the first component and on a second side by the second component, wherein the first component and the second component are configured to be fitted together around a first current-carrying conductor positioned to pass through the first opening and a second current-carrying conductor positioned to pass through the second opening; the first component comprising a first portion of a first inductive energy harvesting device proximal to the first side of the first opening, a first portion of a first current sensing device, different than the first inductive energy harvesting device, proximal to the first side of the first opening, a first portion of a second inductive energy harvesting device proximal to the first side of the second opening, and a first portion of a second current sensing device, different than the second inductive energy harvesting device, proximal to the first side of the second opening; and the second component comprising: a second portion of the first inductive energy harvesting device proximal to the second side of the first opening, a second portion of the first current sensing device proximal to the second side of the first opening, a second portion of the second inductive energy harvesting device proximal to the second side of the second opening, and a second portion of the second current sensing device proximal to the second side of the second opening; an energy storage device; a power supply, coupled to the first energy harvesting device and the second energy harvesting device, configured to charge the energy storage device using power received from the first energy harvesting device and/or the second energy harvesting device; a processor, coupled to the first current sensing device and the second current sensing device, programmed to take a first current measurement using the first current sensing device and a second current measurement using the second current sensing device, and to send the first current measurement and the second current measurement over a wireless communication network.

Embodiment 30. The sensor of embodiment 29, the first inductive energy harvesting device comprising a first split-core ferrite current transformer; the second inductive energy harvesting device comprising a second split-core ferrite current transformer; the first current sensing device comprising a first Rogowski coil, the first Rogowski coil comprising a first partial Rogowski coil, located in the first component, that is electrically connected to a second partial Rogowski coil located in the second component by a first set of separable electrical contacts; and the second current sensing device comprising a second Rogowski coil, the second Rogowski coil comprising a third partial Rogowski coil, located in the first component, that is electrically connected to a fourth partial Rogowski coil located in the second component by a second set of separable electrical contacts Embodiment 31. The sensor of embodiment 29 or 30, the combined unit having a breaker-facing side that includes the first opening and the second opening, wherein: the first inductive energy harvesting device is positioned between the breaker-facing side of the combined unit and the first current sensing device; and the second current sensing device is positioned between the breaker-facing side of the combined unit and the second inductive energy harvesting device.

Embodiment 32. The sensor of any of embodiments 29 through 31, wherein the first current measurement comprises a magnitude or phase measurement.

Embodiment 33. The sensor of any of embodiments 29 through 32, wherein the wireless communication network comprises a Bluetooth network.

Embodiment 34. The sensor of any of embodiments 29 through 33, wherein the processor is further programmed to take the first current measurement repeatedly at a rate that changes depending on at least one parameter.

Embodiment 35. The sensor of embodiment 34, wherein the at least one parameter comprises a prior reading of the first current measurement, a prior reading of the second current measurement, an indication from the power supply that power is not available from either the first inductive energy harvesting device or the second inductive energy harvesting device, a charge indication of the energy storage device, a time of day, or any combination thereof.

Embodiment 36. The sensor of any of embodiments 29 through 35, wherein the first current measurement comprises a magnitude or phase measurement.

Embodiment 37. The sensor of any of embodiments 29 through 36, wherein the wireless communication network comprises a Bluetooth network.

Embodiment 38. A current sensor comprising: a first component and a second component shaped to fit together to create a combined unit with a first opening and a second opening through the combined unit, both the first opening and the second opening bounded on a first side by the first component and on a second side by the second component; the first component comprising a first split ferrite core half proximal to the first side of the first opening and a second split ferrite core half proximal to the first side of the second opening; and the second component comprising: a third split ferrite core half proximal to the second side of the first opening; a fourth split ferrite core half proximal to the second side of the second opening; a first current sense circuit comprising the third split ferrite core half; a second current sense circuit comprising the fourth split ferrite core half; and a processor, coupled to the first current sense circuit and the second current sense circuit, programmed to take a first current measurement using the first current sense circuit and a second current measurement using the second current sense circuit, and to send the first current measurement and the second current measurement over a wireless communication network.

Unless otherwise indicated, all numbers expressing quantities, properties, measurements, and so forth, used in the specification and claims are to be understood as being modified in all instances by the term "about." The recitation of numerical ranges by endpoints includes all numbers subsumed within that range, including the endpoints (e.g. 1 to 5 includes 1, 2.78, π, 3.33, 4, and 5).

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A current sensor comprising:
a first component and a second component shaped to fit together to create a combined unit with a first opening and a second opening through the combined unit, the first opening and the second opening each bounded on a first side by the first component and on a second side by the second component, wherein the first component and the second component are configured to be fitted together around a first current-carrying conductor positioned to pass through the first opening and a second current-carrying conductor positioned to pass through the second opening;
the first component comprising a first portion of a first inductive energy harvesting device proximal to the first side of the first opening, a first portion of a first current sensing device, different than the first inductive energy harvesting device, proximal to the first side of the first opening, a first portion of a second inductive energy harvesting device proximal to the first side of the second opening, and a first portion of a second current sensing device, different than the second inductive energy harvesting device, proximal to the first side of the second opening; and
the second component comprising a second portion of the first inductive energy harvesting device proximal to the second side of the first opening, a second portion of the first current sensing device proximal to the second side of the first opening, a second portion of the second inductive energy harvesting device proximal to the second side of the second opening, and a second portion of the second current sensing device proximal to the second side of the second opening.

2. The sensor of claim 1, the first portion of the first current sensing device comprising a first partial Rogowski coil coupled to a first set of electrical contacts; and
the second portion of the first current sensing device comprising a second partial Rogowski coil coupled to a second set of electrical contacts configured to be electrically coupled to the first set of electrical contacts when the first component and the second component are fitted together.

3. The sensor of claim 2, the first partial Rogowski coil comprising a first multi-layer printed circuit board (PCB) and the second partial Rogowski coil comprising a second multi-layer PCB.

4. The sensor of claim 1, the first portion of the first inductive energy harvesting device comprising a first split ferrite core half and the second portion of the first inductive energy harvesting device comprising a second split ferrite core half.

5. The sensor of claim 1, further comprising:
an energy storage device;
a power supply, coupled to the first inductive energy harvesting device, configured to charge the energy storage device using power received from the first inductive energy harvesting device; and
a processor, coupled to the first current sensing device, programmed to take a current measurement using the first current sensing device and send the current measurement over a wireless communication network.

6. The sensor of claim 5, wherein the processor is further programmed to take the current measurement repeatedly at a rate that changes depending on at least one parameter.

7. The sensor of claim 6, wherein the at least one parameter comprises a prior reading of the current measurement, an indication from the power supply that power is not available from the inductive energy harvesting device, a charge indication of the energy storage device, a time of day, or any combination thereof.

8. The sensor of claims 5, wherein the power supply is further configured to:
provide power to the energy storage device from the first inductive energy harvesting device;
provide power to the processor from the energy storage device; and
provide an indication to the processor as to whether power is available from the first inductive energy harvesting device.

9. The sensor of claim 1, the first opening and the second opening arranged to match a pitch of circuit breakers in a service panel.

10. The sensor of claim 1, the combined unit having a breaker-facing side that includes the opening;
wherein the first inductive energy harvesting device is positioned between the breaker-facing side of the combined unit and the first current sensing device; and
the second current sensing device is positioned between the breaker-facing side of the combined unit and the second inductive energy harvesting device.

11. The sensor of claim 1, further comprising:
an energy storage device;
a power supply, coupled to the first inductive energy harvesting device and the second inductive harvesting energy device, configured to charge the energy storage device using power received from the first inductive energy harvesting device and/or the second inductive energy harvesting device; and
a processor, coupled to the first current sensing device and the second current sensing device, programmed to:
take a first current measurement using the first current sensing device,
take a second current measurement using the second current sensing device, and
send the first current measurement and the second current measurement over a wireless communication network.

12. The sensor of claim 11, wherein the processor is further programmed to take the first current measurement repeatedly at a rate that changes depending on at least one parameter.

13. The sensor of claim 12, wherein the at least one parameter comprises a prior reading of the first current measurement, a prior reading of the second current measurement, a first indication that power is not available from the first inductive energy harvesting device, a second indication that power is not available from the second inductive energy harvesting device, a third indication of a charge level of the energy storage device, a time of day, or any combination thereof.

14. A method for measuring current in a service panel, the method comprising:
providing a first component and a second component configured to fit together to create a combined unit having an opening through the combined unit, the opening bounded on a first side by the first component and on a second side by the second component,
the second component separate from, or hingedly attached to, the first component;
the first component comprising a first portion of an inductive energy harvesting device proximal to the first side of the opening, and a first portion of a current sensing device, different than the inductive energy harvesting device, proximal to the first side of the opening, and
the second component comprising a second portion of the inductive energy harvesting device proximal to the second side of the opening and a second portion of the current sensing device proximal to the second side of the opening,
positioning the first component and the second component in a service panel as the combined unit with a current-carrying conductor passing through the opening in the combined unit, the positioning accomplished while the current-carrying conductor is connected to a breaker in the service panel and a load outside of the service panel;
providing energy harvested by the inductive energy harvesting device from current flowing in the current-carrying conductor to an energy storage device;
providing power to a processor from the energy storage device;
taking a current measurement of the current flowing in the current-carrying conductor under control of the processor using the current sensing device; and
sending the current measurement over a wireless communication network under control of the processor.

15. The method of claim 14, the first portion of the current sensing device comprising a first partial Rogowski coil coupled to a first set of electrical contacts; and
the second portion of the current sensing device comprising a second partial Rogowski coil coupled to a second set of electrical contacts configured to be electrically coupled to the first set of electrical contacts when the first component and the second component are fitted together.

16. The method of claim 15, the first partial Rogowski coil comprising a first multi-layer printed circuit board (PCB) and the second partial Rogowski coil comprising a second multi-layer PCB.

17. The method of claim 14, the first portion of the inductive energy harvesting device comprising a first split ferrite core half and the second portion of the inductive energy harvesting device comprising a second split ferrite core half.

18. The method of claim 14, wherein the combined unit further comprises a second opening bounded on a first side by the first component and on a second side by the second component, wherein the first component and the second component are further configured to be fitted together around a second current-carrying conductor positioned to pass through the second opening;
the first component further comprises a first portion of a second inductive energy harvesting device proximal to the first side of the second opening, and a first portion of a second current sensing device, different than the second inductive energy harvesting device, proximal to the first side of the second opening; and
the second component further comprises a second portion of the second inductive energy harvesting device proximal to the second side of the second opening and a second portion of the second current sensing device proximal to the second side of the second opening;
said positioning further comprising positioning the first component and the second component in the service panel as the combined unit with a second current-carrying conductor passing through the second opening in the combined unit, the positioning accomplished while the second current-carrying conductor is connected to a second breaker in the service panel and a second load outside of the service panel.

19. The method of claim 14, further comprising taking the current measurement repeatedly at a rate that changes depending on at least one parameter.

20. The method of claim 19, wherein the at least one parameter comprises a prior reading of the current measurement, an indication that power is not available from the inductive energy harvesting device, a charge indication of the energy storage device, a time of day, or any combination thereof.

* * * * *